(12) United States Patent
Nakamura et al.

(10) Patent No.: US 9,859,300 B2
(45) Date of Patent: Jan. 2, 2018

(54) LIGHT-EMITTING DEVICE AND INPUT/OUTPUT DEVICE

(71) Applicant: Semiconductor Energy Laboratory Co., Ltd., Atsugi-shi, Kanagawa-ken (JP)

(72) Inventors: Daiki Nakamura, Kanagawa (JP); Hisao Ikeda, Kanagawa (JP); Kouhei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 229 days.

(21) Appl. No.: 14/700,652

(22) Filed: Apr. 30, 2015

(65) Prior Publication Data

US 2015/0318339 A1 Nov. 5, 2015

(30) Foreign Application Priority Data

May 2, 2014 (JP) .................................. 2014-095140

(51) Int. Cl.
| | |
|---|---|
| *H01L 27/12* | (2006.01) |
| *H01L 27/32* | (2006.01) |
| *H01L 51/52* | (2006.01) |

(52) U.S. Cl.
CPC .......... *H01L 27/12* (2013.01); *H01L 27/1255* (2013.01); *H01L 27/3251* (2013.01);
(Continued)

(58) Field of Classification Search
CPC ......... H01L 2251/301; H01L 2251/303; H01L 2251/5315; H01L 2251/5338; H01L 27/12;
(Continued)

(56) References Cited

U.S. PATENT DOCUMENTS

| 7,812,523 B2 | 10/2010 | Jung et al. |
| 8,243,027 B2 | 8/2012 | Hotelling et al. |

(Continued)

FOREIGN PATENT DOCUMENTS

| JP | 2003-174153 A | 6/2003 |
| JP | 2003-196023 A | 7/2003 |

(Continued)

*Primary Examiner* — Bilkis Jahan
*Assistant Examiner* — Victor Barzykin
(74) *Attorney, Agent, or Firm* — Fish & Richardson P.C.

(57) ABSTRACT

To provide a light-emitting device or an input/output device with little unevenness in display luminance or high reliability and to provide an input/output device with high detection sensitivity, a light-emitting device is configured to include a first substrate, a light-emitting element over the first substrate, a first conductive layer over the light-emitting element, a first insulating layer over the first conductive layer, a second conductive layer over the first insulating layer, and a second substrate over the second conductive layer. The light-emitting element includes a first electrode over the first substrate, a layer containing a light-emitting organic compound over the first electrode, and a second electrode over the layer containing a light-emitting organic compound. The second electrode is electrically connected to the first and second conductive layers. The first conductive layer and the second electrode transmit light emitted from the light-emitting element. The resistance of the second conductive layer is lower than that of the second electrode.

21 Claims, 19 Drawing Sheets

(52) U.S. Cl.
CPC ...... *H01L 27/3262* (2013.01); *H01L 27/3279* (2013.01); *H01L 51/524* (2013.01); *H01L 51/5228* (2013.01); *H01L 51/5234* (2013.01); H01L 27/322 (2013.01); H01L 27/323 (2013.01); H01L 27/3246 (2013.01); H01L 51/5218 (2013.01); H01L 51/5284 (2013.01); H01L 2251/301 (2013.01); H01L 2251/303 (2013.01); H01L 2251/5315 (2013.01); H01L 2251/5338 (2013.01)

(58) Field of Classification Search
CPC ... H01L 27/1255; H01L 27/32; H01L 27/322; H01L 27/3251; H01L 27/3262; H01L 27/3279; H01L 51/52; H01L 51/5218
See application file for complete search history.

(56) References Cited

U.S. PATENT DOCUMENTS

| | | | |
|---|---|---|---|
| 8,367,440 B2 | 2/2013 | Takayama et al. | |
| 8,415,208 B2 | 4/2013 | Takayama et al. | |
| 8,598,574 B2 | 12/2013 | Tsurume | |
| 2001/0043046 A1* | 11/2001 | Fukunaga | H01L 27/3244 315/160 |
| 2005/0200292 A1 | 9/2005 | Naugler, Jr. et al. | |
| 2006/0097991 A1 | 5/2006 | Hotelling et al. | |
| 2009/0046077 A1 | 2/2009 | Tanaka et al. | |
| 2009/0085891 A1 | 4/2009 | Yang et al. | |
| 2009/0096371 A1* | 4/2009 | Matsudate | H01L 27/3276 313/505 |
| 2009/0315457 A1* | 12/2009 | Furukawa | H01L 27/1225 313/504 |
| 2010/0163874 A1 | 7/2010 | Koyama et al. | |
| 2011/0273397 A1 | 11/2011 | Hanari | |
| 2011/0316809 A1 | 12/2011 | Kim et al. | |
| 2012/0044202 A1 | 2/2012 | Ishizaki et al. | |
| 2012/0062508 A1 | 3/2012 | Liu et al. | |
| 2012/0242610 A1* | 9/2012 | Yasumatsu | G06F 3/045 345/173 |
| 2012/0244643 A1 | 9/2012 | Yamazaki | |
| 2013/0044074 A1 | 2/2013 | Park et al. | |
| 2013/0127917 A1 | 5/2013 | Kwack et al. | |
| 2013/0214324 A1 | 8/2013 | Takayama et al. | |
| 2013/0299789 A1 | 11/2013 | Yamazaki et al. | |
| 2013/0299791 A1* | 11/2013 | Hirakata | H01L 51/5228 257/40 |
| 2014/0008668 A1* | 1/2014 | Hirakata | H01L 27/15 257/79 |
| 2014/0063368 A1 | 3/2014 | Yamazaki et al. | |
| 2014/0118299 A1 | 5/2014 | Wang et al. | |
| 2014/0353691 A1 | 12/2014 | Lee | |
| 2014/0357019 A1 | 12/2014 | Koyama et al. | |
| 2015/0025518 A1 | 1/2015 | Kobayashi et al. | |
| 2015/0144920 A1 | 5/2015 | Yamazaki et al. | |
| 2015/0261333 A1 | 9/2015 | Kaneyasu et al. | |

FOREIGN PATENT DOCUMENTS

| | | |
|---|---|---|
| JP | 2007-141844 | 6/2007 |
| JP | 2007-207460 | 8/2007 |
| JP | 2009-003916 A | 1/2009 |
| JP | 2012-216514 | 11/2012 |

* cited by examiner

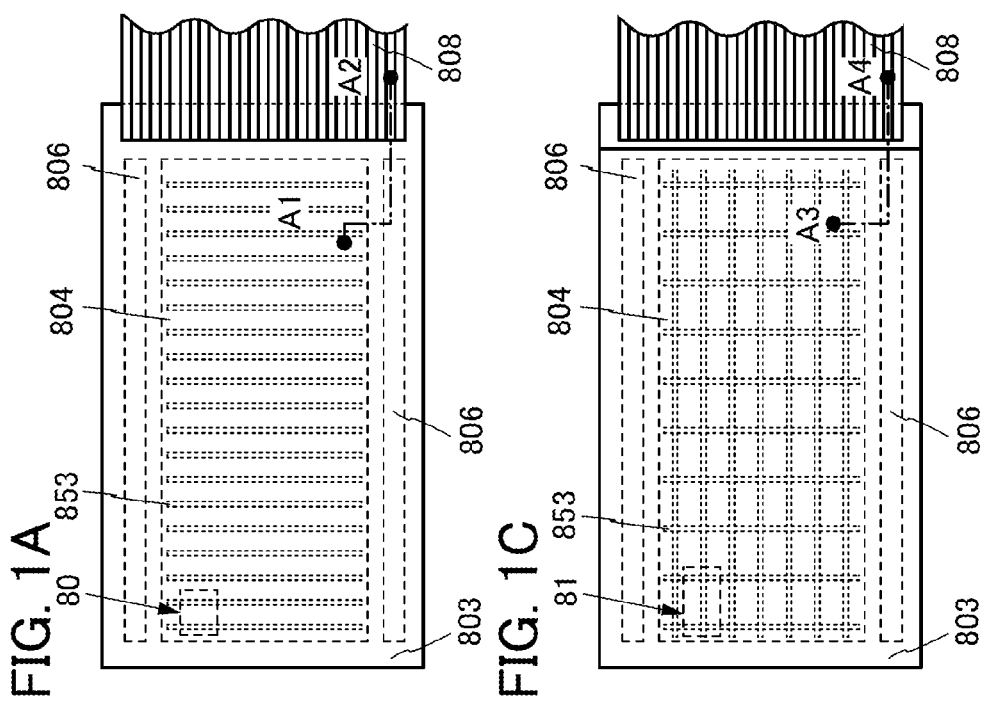
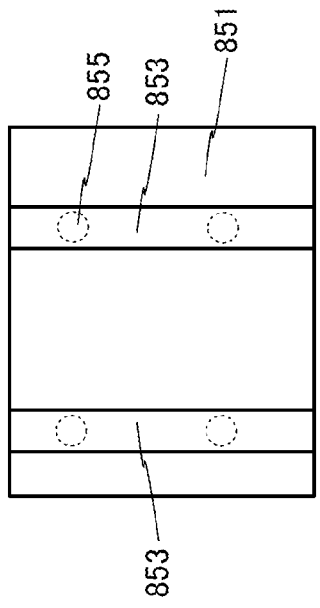
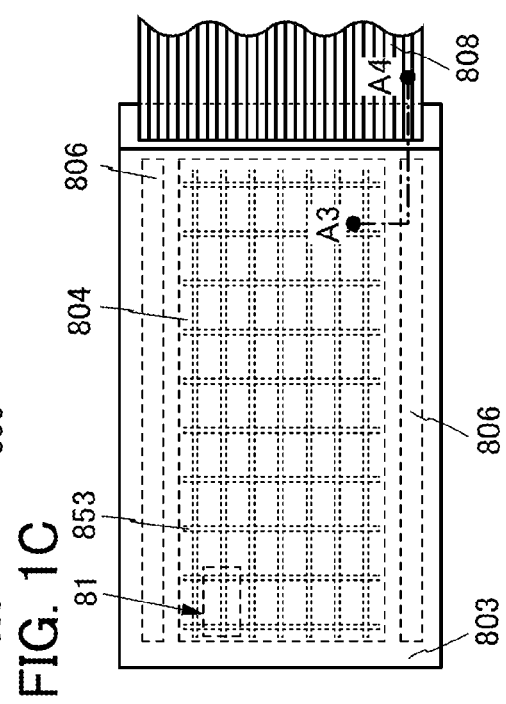

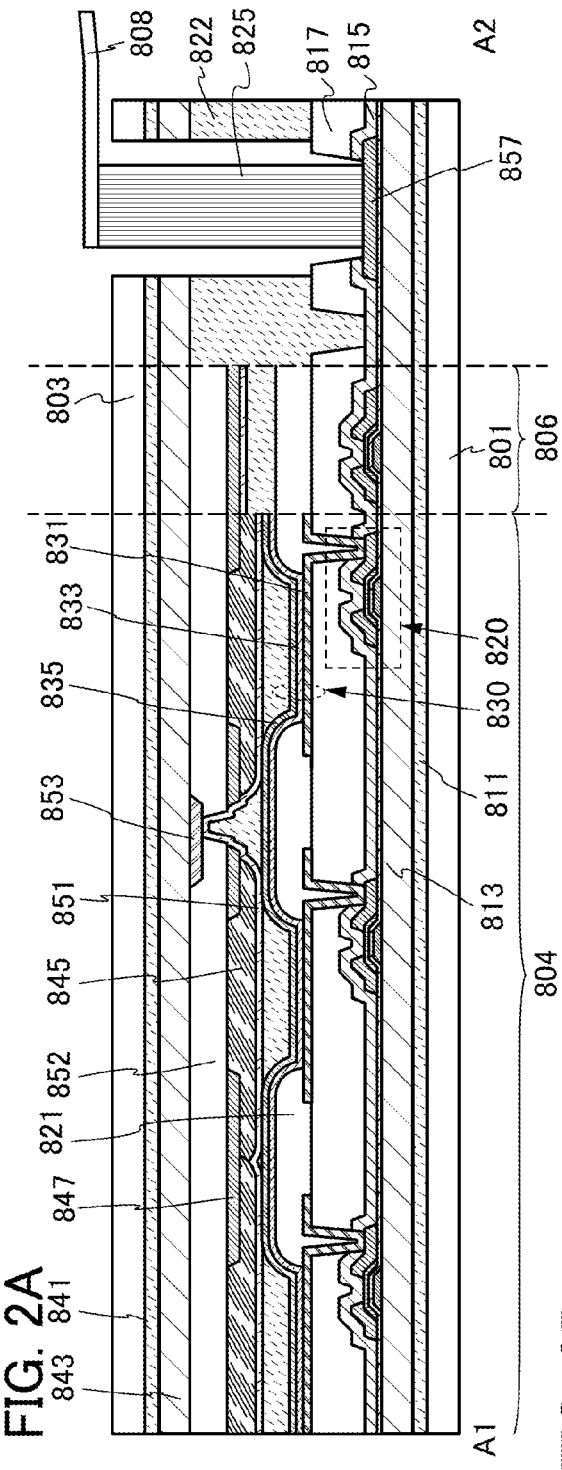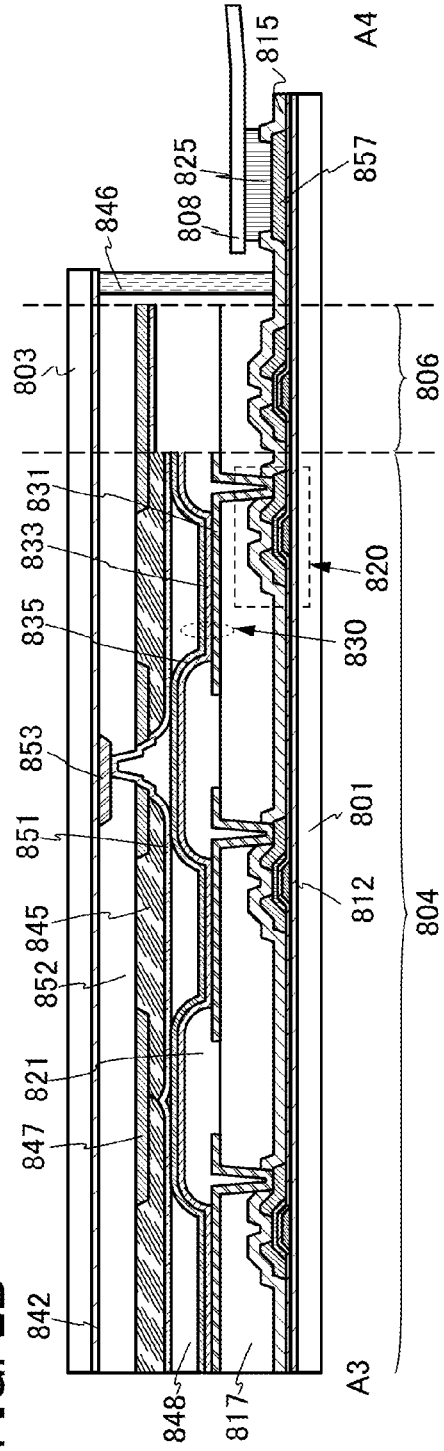

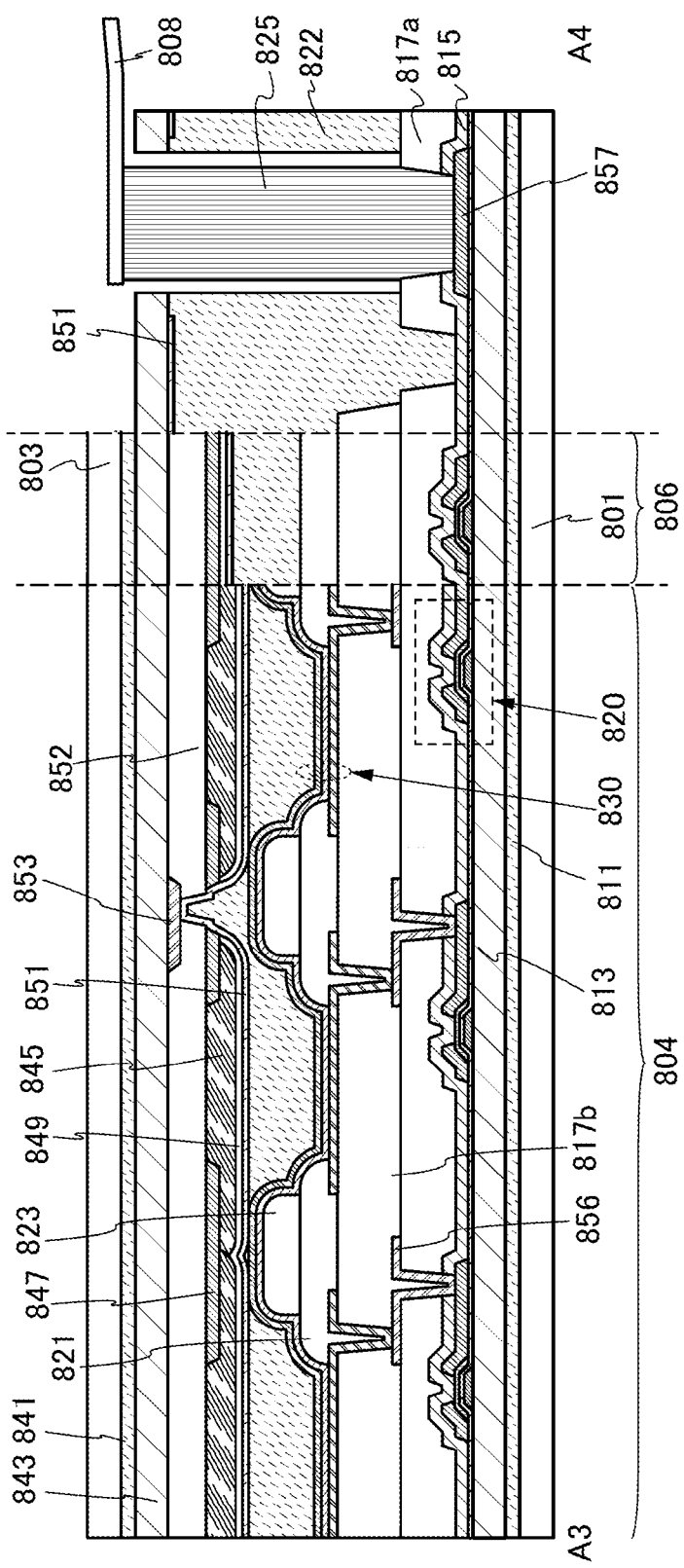

FIG. 7A
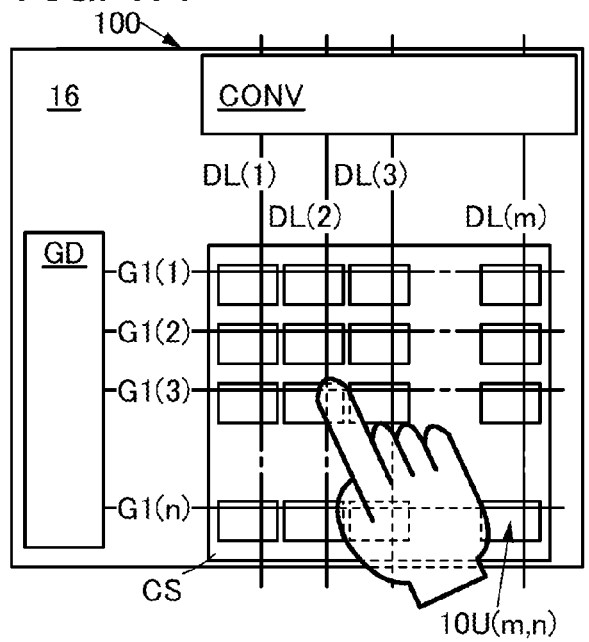
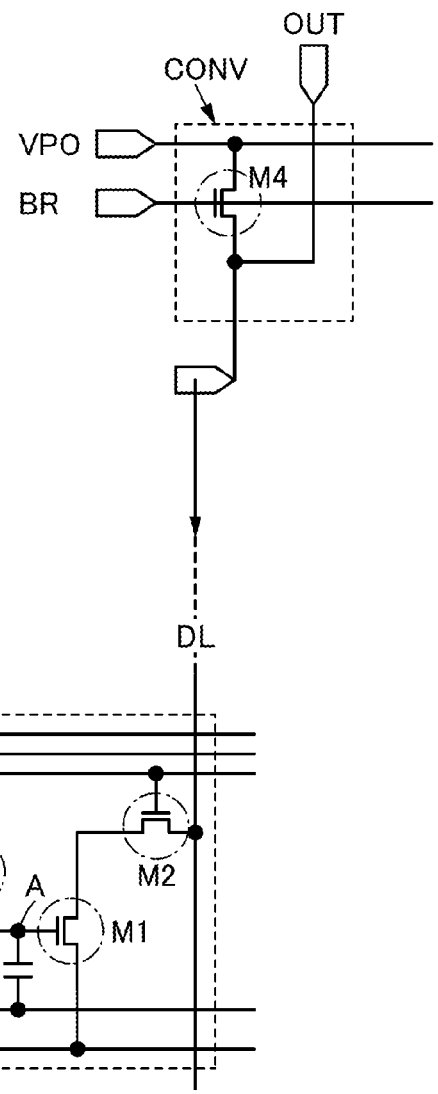
FIG. 7B
FIG. 7C1
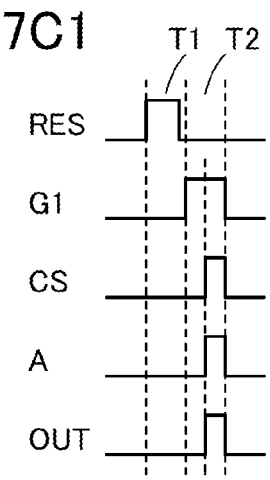
FIG. 7C2
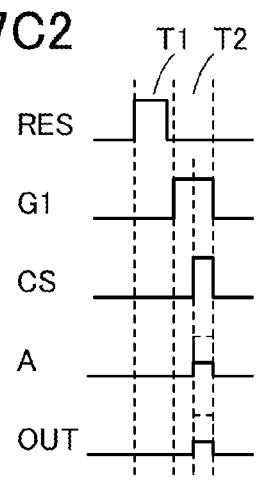

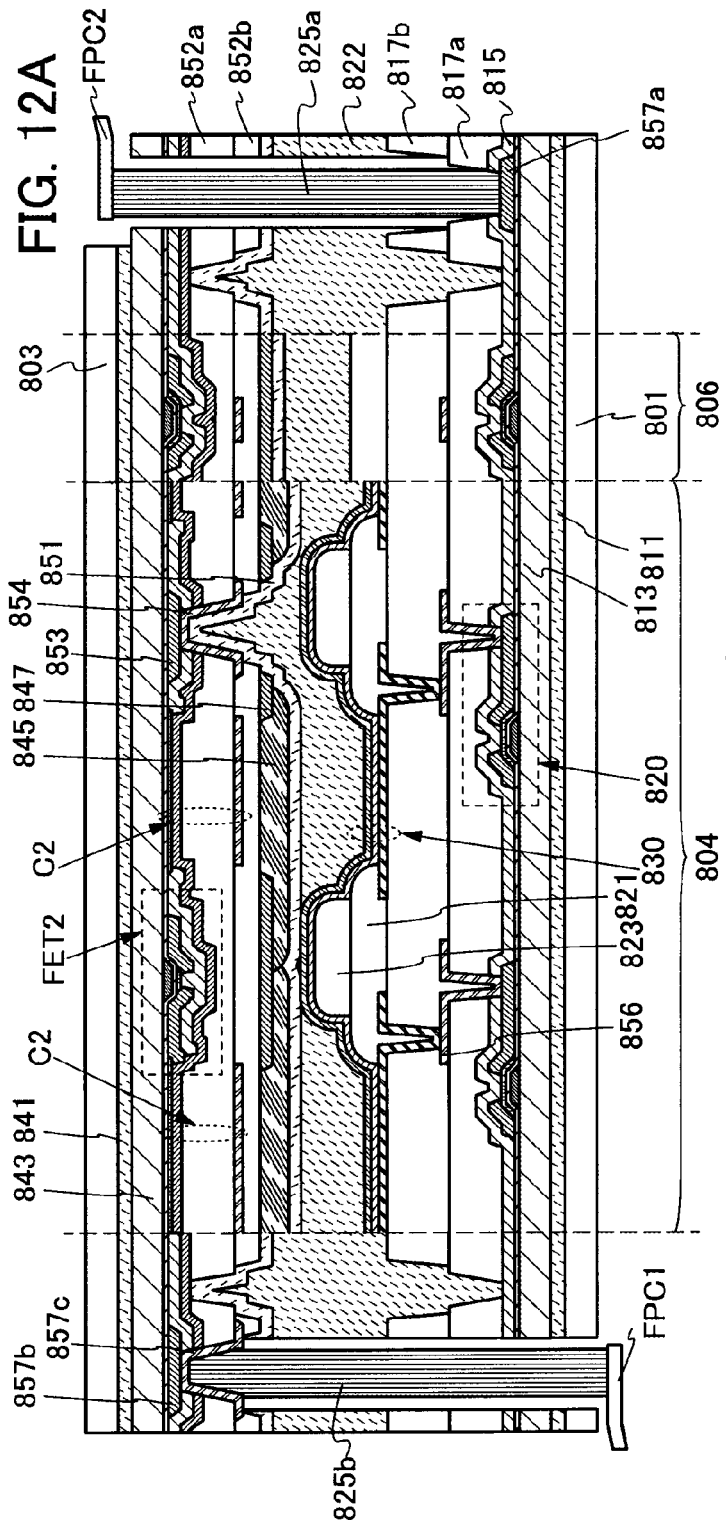

LIGHT-EMITTING DEVICE AND INPUT/OUTPUT DEVICE

BACKGROUND OF THE INVENTION

1. Field of the Invention

One embodiment of the present invention relates to a light-emitting device and an input/output device, and particularly to a flexible light-emitting device and a flexible input/output device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an electronic device, a lighting device, an input device (e.g., a touch sensor), an output device, an input/output device (e.g., a touch panel), a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin-film solar cell and an organic thin-film solar cell), and an electronic device may each include a semiconductor device.

2. Description of the Related Art

Light-emitting elements utilizing electroluminescence (EL), which are referred to as EL elements, have features of the ease of being thinner and lighter, high speed response to input signals, and capability of DC low voltage driving and have been expected to be applied to display devices and lighting devices.

Furthermore, a flexible device in which a functional element such as a semiconductor element, a display element, or a light-emitting element is provided over a substrate having flexibility (hereinafter also referred to as flexible substrate) has been developed. Typical examples of the flexible device include a lighting device, an image display device, and a variety of semiconductor circuits including a semiconductor element such as a transistor.

Patent Document 1 discloses a flexible active matrix light-emitting device in which an organic EL element and a transistor serving as a switching element are provided over a film substrate.

Display devices are expected to be applied to a variety of uses and become diversified. For example, a smartphone and a tablet with a touch panel are being developed as portable information appliances.

REFERENCE

Patent Document 1: Japanese Published Patent Application No. 2003-174153

SUMMARY OF THE INVENTION

An object of one embodiment of the present invention is to provide a light-emitting device or an input/output device with little unevenness in display luminance. Another object of one embodiment of the present invention is to provide a light-emitting device or an input/output device with high reliability. Another object of one embodiment of the present invention is to provide an input/output device with high detection sensitivity.

Another object of one embodiment of the present invention is to manufacture a light-emitting device or an input/output device with a small number of steps. Another object of one embodiment of the present invention is to manufacture a light-emitting device or an input/output device with high yield.

Another object of one embodiment of the present invention is to provide a flexible light-emitting device or a flexible input/output device. Another object of one embodiment of the present invention is to provide a lightweight light-emitting device or a lightweight input/output device. Another object of one embodiment of the present invention is to provide a thin light-emitting device or a thin input/output device. Another object of one embodiment of the present invention is to achieve both a reduction in thickness and high detection sensitivity of an input/output device. Another object of one embodiment of the present invention is to provide a light-emitting device that can be used in a large-size input/output device. Another object of one embodiment of the present invention is to provide a large-size input/output device.

Another object of one embodiment of the present invention is to provide a light-emitting device or an input/output device with high resistance to repeated bending. Another object of one embodiment of the present invention is to provide a novel semiconductor device, a novel light-emitting device, a novel display device, a novel input/output device, a novel electronic device, or a novel lighting device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device including a first substrate, a light-emitting element over the first substrate, a first conductive layer over the light-emitting element, a first insulating layer over the first conductive layer, a second conductive layer over the first insulating layer, and a second substrate over the second conductive layer. The light-emitting element includes a first electrode over the first substrate, a first layer over the first electrode, and a second electrode over the first layer. The first layer contains a light-emitting organic compound. The second electrode, the first conductive layer, and the second conductive layer are electrically connected to each other. The first conductive layer and the second electrode transmit light emitted from the light-emitting element. The resistance of the second conductive layer is lower than that of the second electrode.

Another embodiment of the present invention is a light-emitting device including a first substrate, a light-emitting element over the first substrate, a first conductive layer over the light-emitting element, a first insulating layer over the first conductive layer, a second conductive layer over the first insulating layer, and a second substrate over the second conductive layer. The light-emitting element includes a first electrode, a first layer, and a second electrode. The first electrode is placed over the first substrate. The first layer is placed over the first electrode. The second electrode is placed over the first layer. The second electrode is electrically connected to the first conductive layer and the second conductive layer. The first conductive layer includes a first portion and a second portion. The second electrode includes a third portion and a fourth portion. The resistance of the first portion is lower than that of the third portion. The second portion has a function of transmitting light emitted from the light-emitting element. The fourth portion has a function of transmitting light emitted from the light-emitting element.

In the light-emitting device with each of the above structures, hollow sealing or solid sealing may be used. For example, there may be a space between the light-emitting element and the first conductive layer. A bonding layer may be provided between the light-emitting element and the first conductive layer.

The light-emitting device with each of the above structures may include a first transistor, in which case it is preferred that the first transistor be placed between the first substrate and the light-emitting element and electrically connected to the light-emitting element. Specifically, a source electrode or a drain electrode of the first transistor is preferably electrically connected to the first electrode.

One embodiment of the present invention is an input/output device including the light-emitting device with one of the above structures, a second transistor, and a capacitor. The second transistor and the capacitor are electrically connected to each other. The second transistor and the capacitor are placed between the first conductive layer and the second substrate. A gate electrode or source and drain electrodes of the second transistor and the second conductive layer are formed on the same plane and contain the same material.

One embodiment of the present invention is an input/output device including a first substrate, a first transistor over the first substrate, a light-emitting element over the first transistor, a bonding layer over the light-emitting element, a first conductive layer over the bonding layer, a first insulating layer over the first conductive layer, a second conductive layer over the first insulating layer, a second substrate over the second conductive layer, and a second transistor and a capacitor between the first conductive layer and the second substrate. The light-emitting element emits light toward the second substrate. The first transistor and the light-emitting element are electrically connected to each other. The second transistor and the capacitor are electrically connected to each other. The first conductive layer overlaps with the light-emitting element. The first conductive layer transmits light emitted from the light-emitting element. The first conductive layer is electrically connected to the second conductive layer. The first conductive layer can be supplied with a predetermined potential. It is preferred that the second conductive layer be formed on the same plane as and contain the same material as a gate electrode or source and drain electrodes of the second transistor.

In each of the above structures, it is preferred that the capacitor include a pair of electrodes and a dielectric layer placed between the pair of electrodes, and that one of the pair of electrodes include an oxide conductor layer.

In each of the above structures, the first substrate and the second substrate are preferably flexible.

The light-emitting device or the input/output device with each of the above structures may include a coloring layer between the first insulating layer and the first conductive layer, in which case the coloring layer preferably overlaps with the light-emitting element, specifically, there is preferably a region where the coloring layer and the light-emitting element overlap with each other. When the light-emitting device includes a bonding layer in contact with the first conductive layer, the wettability of the first conductive layer to a resin used for the bonding layer is preferably higher than that of the coloring layer.

The light-emitting device or the input/output device with each of the above structures may include a first light-blocking layer between the first insulating layer and the first conductive layer, in which case the first light-blocking layer preferably overlaps with the second conductive layer. Specifically, there is preferably a region where the first light-blocking layer and the second conductive layer overlap with each other. When the light-emitting device includes a bonding layer in contact with the first conductive layer, the wettability of the first conductive layer to a resin used for the bonding layer is preferably higher than that of the first light-blocking layer.

The light-emitting device or the input/output device with each of the above structures may include a second light-blocking layer between the second substrate and the first conductive layer, in which case the second light-blocking layer preferably overlaps with the second conductive layer. Specifically, there is preferably a region where the second light-blocking layer and the second conductive layer overlap with each other.

Note that the light-emitting device or the input/output device of one embodiment of the present invention is preferably flexible.

Note that the light-emitting device in this specification includes, in its category, a display device using a light-emitting element. Furthermore, the light-emitting device may be included in a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. The light-emitting device may be included in lighting equipment or the like.

One embodiment of the present invention can provide a light-emitting device or an input/output device with little unevenness in display luminance. Another embodiment of the present invention can provide a light-emitting device or an input/output device with high reliability. Another embodiment of the present invention can provide an input/output device with high detection sensitivity.

Another embodiment of the present invention can manufacture an input/output device with a small number of steps. Another embodiment of the present invention can manufacture an input/output device with high yield.

Another embodiment of the present invention can provide a flexible light-emitting device or a flexible input/output device. Another embodiment of the present invention can provide a lightweight light-emitting device or a lightweight input/output device. Another embodiment of the present invention can provide a thin light-emitting device or a thin input/output device. Another embodiment of the present invention can achieve both a reduction in thickness and high detection sensitivity of an input/output device. Another embodiment of the present invention can provide a light-emitting device that can be used in a large-size input/output device. Another embodiment of the present invention can provide a large-size input/output device.

Another embodiment of the present invention can provide a method for manufacturing an input/output device with a small number of steps.

Another embodiment of the present invention can provide a light-emitting device or an input/output device with high resistance to repeated bending. Another embodiment of the present invention can provide a novel semiconductor device, a novel light-emitting device, a novel display device, a novel input/output device, a novel electronic device, or a novel lighting device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 1A to 1C and 1D1 to 1D3 illustrate examples of a light-emitting device;

FIGS. 2A and 2B each illustrate an example of a light-emitting device;

FIGS. 3A and 3B each illustrate an example of a light-emitting device;

FIGS. 7A and 7B illustrate an example of configurations of a sensing circuit and a converter, and FIGS. 7C1 and 7C2 illustrate an example of a method for driving the sensing circuit;

FIGS. 12A and 12B illustrate an example of an input/output device;

DETAILED DESCRIPTION OF THE INVENTION

Figure 4:
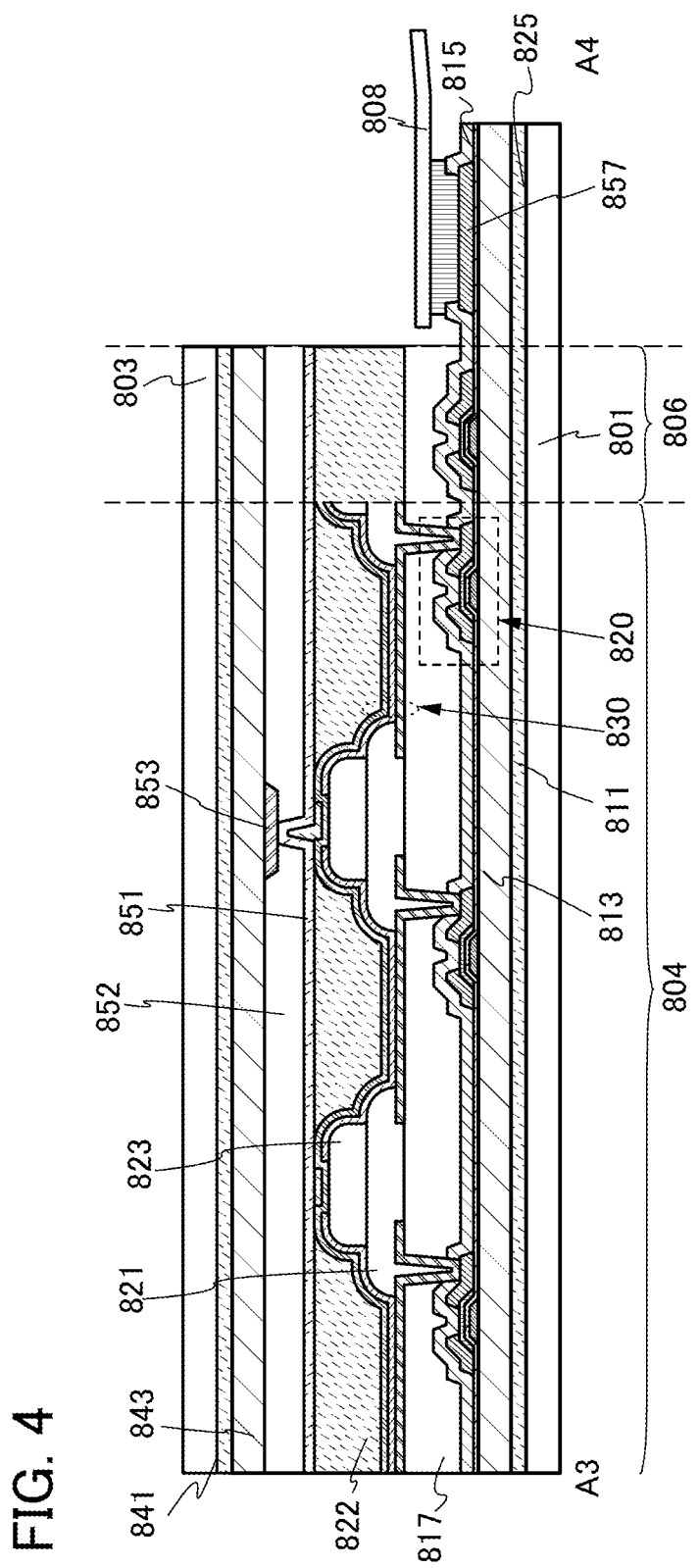
FIG. 4 illustrates an example of a light-emitting device.

Embodiments will be described in detail with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. In some cases, the same hatching pattern is used for portions having similar functions, and the portions are not denoted by reference numerals.

The position, size, range, or the like of each structure illustrated in drawings and the like is not accurately represented in some cases for easy understanding. Therefore, the disclosed invention is not necessarily limited to the position, size, range, or the like disclosed in the drawings and the like.

Note that the terms "film" and "layer" can be interchanged with each other depending on circumstances or situations. For example, in some cases, the term "conductive film" can be used instead of the term "conductive layer," and the term "insulating layer" can be used instead of the term "insulating film."

Embodiment 1

In this embodiment, a light-emitting device of one embodiment of the present invention will be described with reference to drawings.

Although this embodiment shows an example in which an organic EL element is used as a light-emitting element, a light-emitting device of one embodiment of the present invention is not limited to this and may include another light-emitting element.

In an active-matrix light-emitting device, a light-emitting element and a transistor are electrically connected to each other in each pixel, and light emission of the light-emitting element of each pixel is individually controlled. An organic EL element, which is an example of a light-emitting element, includes a layer containing a light-emitting organic compound (also referred to as EL layer) between a lower electrode (also referred to as first electrode) and an upper electrode (also referred to as second electrode). A separate lower electrode is provided for each pixel; that is, the lower electrodes in adjacent pixels are electrically insulated from each other. The upper electrode can be used in common between a plurality of pixels.

In a large-area electrode such as an upper electrode used in common between a plurality of pixels or an electrode of a large light-emitting element for lighting application or the like, a potential drop may occur because of the resistance of the electrode. A large potential drop may cause a luminance gradient to be observed in display on the light-emitting device.

The light-emitting element can have any of a top emission structure, a bottom emission structure, and a dual emission structure. The light-emitting element preferably employs a top emission structure, in which case the light-emitting device can have a higher aperture ratio more easily than that employing a bottom-emission light-emitting element.

In the top-emission light-emitting element, an upper electrode needs to transmit light from the EL layer because light is extracted through the upper electrode. For example, the upper electrode can be formed using a light-transmitting conductive material such as indium tin oxide (ITO). Since such a light-transmitting conductive material has relatively high resistance among conductive materials used for electrodes, the aforementioned potential drop and luminance gradient in display on the light-emitting device might be significant.

To avoid the issue, the electrode of the light-emitting element is preferably electrically connected to an auxiliary electrode (also referred to as auxiliary wiring) with lower resistance than the electrode.

When an auxiliary electrode is formed over the light-emitting element, damage may be caused to the light-emitting element. For example, when a conductive layer to be the auxiliary electrode is formed by a sputtering method, thermal and physical damage is concerned. When the conductive layer is processed by a photolithography method or the like, optical or thermal damage, melting of the light-emitting element due to an organic solvent or the like in removal of a resist, or the like is concerned.

In view of the above, in one embodiment of the present invention, a first electrode, an EL layer, and a second electrode are formed in this order over a first substrate, and a second conductive layer, an insulating layer, and a first conductive layer are formed in this order over a second substrate. In this structure, the first conductive layer and the second conductive layer are electrically connected to each other through an opening in the insulating layer. The first substrate and the second substrate face each other so that the second electrode and the first conductive layer are connected to each other. Thus, the first conductive layer, the second conductive layer, and the second electrode can be electrically connected to each other.

In this manner, the conductive layer formed on the second substrate side is electrically connected to the second electrode of the light-emitting element formed over the first substrate, whereby the conductive layer can increase the conductivity of the second electrode. This structure can suppress a potential drop due to the resistance of the second electrode and suppress unevenness in display luminance even in a light-emitting device including a large-area light-emitting element or a top-emission light-emitting element. Moreover, the auxiliary electrode protects the light-emitting element from damage, so that the light-emitting device can have high reliability.

The first conductive layer is preferably formed extensively on the whole surface of the light-emitting device by using a material that transmits light from the light-emitting element. Accordingly, the area where the second electrode and the first conductive layer are in contact with each other can be increased, and the contact resistance between the second electrode and the first conductive layer can be lowered. The second conductive layer can use a wider range of materials than the first conductive layer because it does not necessarily have transmittance. The second conductive layer is formed using a material with lower resistance than the second electrode and the first conductive layer, whereby a voltage drop of the second electrode can be further suppressed. Thus, one embodiment of the present invention achieves a light-emitting device with little unevenness in display luminance.

Note that in one embodiment of the present invention, the resistance of at least one of the first and second conductive layers is lower than that of the second electrode.

Here, the resistances of the first and second conductive layers and the second electrode are obtained from (resistance×length)÷(width×thickness).

In one embodiment of the present invention, the sheet resistance of at least one of the first and second conductive layers is lower than that of the second electrode.

Here, the sheet resistances of the first and second conductive layers and the second electrode are obtained from (resistance÷thickness).

The first and second conductive layers and the second electrode may contain materials with different resistances or materials with the same resistance.

Specifically, a light-emitting device of one embodiment of the present invention includes a first substrate, a light-emitting element over the first substrate, a first conductive layer over the light-emitting element, a first insulating layer over the first conductive layer, a second conductive layer over the first insulating layer, and a second substrate over the second conductive layer. The light-emitting element includes a first electrode over the first substrate, an EL layer over the first electrode, and a second electrode over the EL layer. The second electrode is electrically connected to the first conductive layer and the second conductive layer. The first conductive layer and the second electrode transmit light emitted from the light-emitting element. The resistance of the second conductive layer is lower than that of the second electrode.

In the above structure, the light-emitting element, the first conductive layer, the first insulating layer, and the second conductive layer may be included in a space formed by the first substrate, the second substrate, and a bonding layer.

Alternatively, in the above structure, the first substrate and the second substrate may be attached to each other with a bonding layer. Specifically, the bonding layer for filling a space between the first substrate and the second substrate may be positioned between the light-emitting element and the first conductive layer. In this case, the wettability of the first conductive layer to a material of the bonding layer is preferably high. High wettability to the material of the bonding layer can reduce air bubbles that enter when the first substrate and the second substrate are attached to each other, and the substrates can be attached with a high yield. Moreover, the light-emitting device can be highly reliable.

Examples of a light-emitting device of one embodiment of the present invention will be described below.

FIG. 1A is a plan view of a light-emitting device of one embodiment of the present invention. FIG. 1B is an enlarged view of a region surrounded by a dotted frame 80 in FIG. 1A. FIG. 2A is a cross-sectional view along dashed-dotted line A1-A2 in FIG. 1A.

FIG. 1C is a plan view of a light-emitting device of another embodiment of the present invention. FIGS. 1D1 to 1D3 show examples of an enlarged view of a region surrounded by a dotted frame 81 in FIG. 1C. FIG. 2B, FIG. 3A, and FIG. 4 show examples of a cross-sectional view along dashed-dotted line A3-A4 in FIG. 1C.

The light-emitting devices illustrated in FIGS. 1A and 1C each include a light-emitting unit 804 and a driver circuit unit 806. Light emitted from a light-emitting element included in the light-emitting unit 804 is extracted through a substrate 803. A flexible printed circuit (FPC) 808 is connected to the light-emitting device. The light-emitting unit 804 includes a conductive layer 853 functioning as an auxiliary electrode of an upper electrode of the light-emitting element.

The light-emitting device in FIG. 1A includes a plurality of striped conductive layers 853. The light-emitting device in FIG. 1C includes a grid-like conductive layer 853. There is no particular limitation on the planar shape and the number of the conductive layers 853 functioning as an auxiliary electrode. The conductive layer 853 is preferably positioned not to overlap with a light-emitting region of the light-emitting element included in the light-emitting unit 804, in which case the auxiliary electrode can be provided without a reduction in the area of the light-emitting region.

The enlarged views in FIGS. 1B and 1D1 to 1D3 show examples of a contact portion 855 for connecting the conductive layer 853 and a conductive layer 851. Although there is no particular limitation on the position and the number of the contact portions 855, the area where the conductive layers 851 and 853 are in contact with each other is preferably large because the contact resistance between the conductive layers 851 and 853 can be lowered accordingly.

As illustrated in FIGS. 1B and 1D1 to 1D3, one conductive layer 853 is connected to the conductive layer 851 through at least one contact portion 855. FIG. 1D1 illustrates an example where the contact portions 855 are arranged in one direction. FIGS. 1D2 and 1D3 each illustrate an example where the contact portions 855 are arranged in a plurality of directions.

Specific Example 1 of Cross-Sectional Structure

The light-emitting device illustrated in FIG. 2A is a top-emission light-emitting device using a color filter method. In this embodiment, the light-emitting device can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan or magenta may be used.

The light-emitting device in FIG. 2A includes a substrate 801, a bonding layer 811, an insulating layer 813, a plurality of transistors, a conductive layer 857, an insulating layer 815, an insulating layer 817, a plurality of light-emitting elements, an insulating layer 821, a bonding layer 822, the conductive layer 851, an insulating layer 852, the conductive layer 853, a coloring layer 845, a light-blocking layer 847, an insulating layer 843, a bonding layer 841, and the substrate 803. The bonding layer 822, the conductive layer 851, the insulating layer 852, the insulating layer 843, the bonding layer 841, and the substrate 803 transmit visible light.

In FIG. 2A, the light-emitting elements and the transistors included in the light-emitting unit 804 and the driver circuit unit 806 are sealed with the substrate 801, the substrate 803, and the bonding layer 822.

To fabricate the light-emitting device in FIG. 2A, first, a pair of formation substrates is prepared. The insulating layer 813, a transistor 820, a light-emitting element 830, and the like are formed over one of the formation substrates. The insulating layer 843, the conductive layer 851, the insulating layer 852, the conductive layer 853, and the like are formed over the other formation substrate. Subsequently, the formation substrates are attached to each other with the bonding layer 822. Then, the formation substrates are peeled, the substrate 801 is attached to the exposed insulating layer 813 with the bonding layer 811, and similarly, the substrate 803 is attached to the exposed insulating layer 843 with the bonding layer 841. Thus, the light-emitting device is completed. Note that a method for manufacturing a light-emitting device of one embodiment of the present invention will be described in detail in Embodiment 5.

When a material with low heat resistance (e.g., resin) is used for a substrate, it is difficult to expose the substrate to high temperature in the manufacturing process; thus, there is a limitation on conditions for forming a transistor and an insulating film over the substrate. When a material with low moisture resistance (e.g., resin) is used for a substrate of a light-emitting device, it is preferable to form a film with high moisture resistance at high temperatures between the substrate and a light-emitting element. Since a transistor and the like can be formed over a formation substrate with high heat resistance in the manufacturing method of this embodiment, a highly reliable transistor and an insulating film with sufficiently high moisture resistance can be formed at high temperatures. Then, the transistor and the insulating film are transferred to a substrate with low heat resistance, whereby a highly reliable light-emitting device can be manufactured. Thus, in one embodiment of the present invention, a thin or/and lightweight light-emitting device with high reliability can be provided.

Although there is no particular limitation on a material of the substrates 801 and 803, the substrates 801 and 803 are preferably flexible. The use of flexible substrates achieves a flexible light-emitting device and can reduce the weight and thickness of the light-emitting device.

In the light-emitting unit 804, the transistor 820 and the light-emitting element 830 are provided over the substrate 801 with the bonding layer 811 and the insulating layer 813 placed therebetween. The light-emitting element 830 includes a first electrode 831 over the insulating layer 817, an EL layer 833 over the first electrode 831, and a second electrode 835 over the EL layer 833. The first electrode 831 is electrically connected to a source electrode or a drain electrode of the transistor 820. An end portion of the first electrode 831 is covered with the insulating layer 821. The first electrode 831 preferably reflects visible light. The second electrode 835 transmits visible light.

In the light-emitting unit 804, the coloring layer 845 overlapping the light-emitting element 830 and the light-blocking layer 847 overlapping the insulating layer 821 are provided. The coloring layer 845 and the light-blocking layer 847 are covered with the conductive layer 851. The space between the light-emitting element 830 and the conductive layer 851 is filled with the bonding layer 822.

The conductive layer 851 is connected to the conductive layer 853 through an opening in the insulating layer 852. The conductive layer 851 is also connected to the second electrode 835. That is, the second electrode 835, the conductive layer 851, and the conductive layer 853 are electrically connected to each other. Electrically connecting the second electrode 835, the conductive layer 851, and the conductive layer 853 can suppress a voltage drop of the second electrode 835, thereby reducing unevenness in display luminance of the light-emitting device. Note that the insulating layer 852 is not necessarily provided. An overcoat may be provided between the conductive layer 851 and the coloring layer 845 or the light-blocking layer 847.

Since the conductive layer 851 is formed using a material that transmit light from the light-emitting element 830, the conductive layer 851 can be formed extensively on the whole surface of the light-emitting device. Accordingly, the area where the second electrode 835 and the conductive layer 851 are in contact with each other can be increased, and the contact resistance between the second electrode 835 and the conductive layer 851 can be lowered. Furthermore, the area where the conductive layers 851 and 853 are in contact with each other is preferably large because the contact resistance between the conductive layers 851 and 853 can be lowered accordingly.

The conductive layer 853 does not necessarily have transmittance because it does not overlap a light-emitting region of the light-emitting element 830 (i.e., it overlaps the insulating layer 821). For this reason, the conductive layer 853 can be formed using a wider range of materials than the conductive layer 851. When the conductive layer 853 is formed using a material with lower resistance than the second electrode 835 and the conductive layer 851, a voltage drop of the second electrode 835 can be further suppressed.

A conductive film that transmits visible light and can be used for the conductive layer 851 can be formed using indium oxide, ITO, indium zinc oxide, zinc oxide, or zinc oxide to which gallium is added, for example. It is also possible to use a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) when the film is thin enough to have a light-transmitting property. Alternatively, a stack of any of the above materials can be used for the conductive film. For example, a stacked film of ITO and an alloy of silver and magnesium is preferably used, in which case conductivity can be increased. Further alternatively, graphene or the like may be used.

The conductive layer 853 can be formed with a single-layer structure or a stacked-layer structure using any of metal materials such as molybdenum, titanium, chromium, tantalum, tungsten, aluminum, copper, neodymium, and scandium, and an alloy material containing any of these elements. The conductive layer 853 may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used. Moreover, the conductive layer 853 may be formed using a material for another conductive layer such as the conductive layer 851.

Note that each of the conductive layers 851 and 853 may have a single-layer structure or a stacked-layer structure.

The substrate 801 and the substrate 803 are attached to each other with the bonding layer 822. The bonding layer 822 is positioned between the light-emitting element 830 and the conductive layer 851. In this case, the wettability of the conductive layer 851 to a material of the bonding layer 822 is preferably high. High wettability to the material of the bonding layer 822 can reduce air bubbles entering when the pair of formation substrates are attached to each other, and the substrates can be attached with a high yield. Moreover, the light-emitting device can be highly reliable. For example, when a resin is used for the bonding layer 822, the conductive layer 851 is preferably an oxide conductive film such as an ITO film or a metal film such as an Ag film that is thin enough to transmit light, in particular preferably an ITO film. The conductive layer 851 may be provided only in the light-emitting unit 804, provided in the light-emitting unit 804 and the driver circuit unit 806, or provided on the entire surface over the insulating layer 843.

The insulating layer 815 has an effect of preventing diffusion of impurities into a semiconductor included in the transistor. Moreover, the insulating layer 817 is preferably an insulating layer with a planarization function in order to reduce surface unevenness due to the transistor.

In the driver circuit unit 806, a plurality of transistors are provided over the substrate 801 with the bonding layer 811 and the insulating layer 813 positioned therebetween. FIG. 2A illustrates one of the transistors included in the driver circuit unit 806.

The insulating layer 813 and the substrate 801 are attached with the bonding layer 811. The insulating layer 843 and the substrate 803 are attached with the bonding layer 841. The insulating layer 813 and the insulating layer 843 are preferably highly resistant to moisture, in which case impurities such as water can be prevented from entering the light-emitting element 830 or the transistor 820, leading to higher reliability of the light-emitting device.

The conductive layer 857 is electrically connected to an external input terminal through which a signal (e.g., a video signal, a clock signal, a start signal, or a reset signal) or a potential from the outside is transmitted to the driver circuit unit 806. Here, an example in which the FPC 808 is provided as the external input terminal is described. To prevent an increase in the number of fabrication steps, the conductive layer 857 is preferably formed using the same material and the same step as those of the electrode or the wiring in the light-emitting unit or the driver circuit unit. Here, an example is described in which the conductive layer 857 is formed using the same material and the same step as those of the electrodes of the transistor 820.

In the light-emitting device in FIG. 2A, the FPC 808 is positioned above the substrate 803. A connector 825 is connected to the conductive layer 857 through an opening provided in the substrate 803, the bonding layer 841, the insulating layer 843, the bonding layer 822, the insulating layer 817, and the insulating layer 815. Furthermore, the connector 825 is connected to the FPC 808. That is, the FPC 808 and the conductive layer 857 are electrically connected to each other through the connector 825. When the conductive layer 857 and the substrate 803 overlap with each other, an opening formed in the substrate 803 (or the use of a substrate with an opening) allows the conductive layer 857, the connector 825, and the FPC 808 to be electrically connected to each other.

Note that a user of the light-emitting device in FIG. 2A may recognize the conductive layer 853 or the like. For this reason, a film with low reflectivity or a light-blocking film may be provided between the substrate 803 and the conductive layer 853. Moreover, a conductive film with low reflectivity may be used as the conductive layer 853.

Specific Example 2 of Cross-Sectional Structure

FIG. 2B illustrates a top-emission light-emitting device using a color filter method, which is different from that in FIG. 2A. In subsequent specific examples, differences from Specific Example 1 are described in detail, and description of the same points is omitted.

The light-emitting device in FIG. 2B includes the substrate 801, an insulating layer 812, a plurality of transistors, the conductive layer 857, the insulating layer 815, the insulating layer 817, a plurality of light-emitting elements, the insulating layer 821, a bonding layer 846, the conductive layer 851, the insulating layer 852, the conductive layer 853, the coloring layer 845, the light-blocking layer 847, an insulating layer 842, and the substrate 803. The conductive layer 851, the insulating layer 852, the insulating layer 842, and the substrate 803 transmit visible light.

In FIG. 2B, the light-emitting elements and the transistors included in the light-emitting unit 804 and the driver circuit unit 806 are sealed in a space 848 formed by the substrate 801, the substrate 803, and the bonding layer 846. The space 848 may be filled with an inert gas such as a rare gas or a nitrogen gas or a solid such as organic resin, or may be in a reduced-pressure atmosphere. The amount of impurities such as water or oxygen is preferably small in the space 848, in which case the reliability of the light-emitting elements is increased.

As in the light-emitting device illustrated in FIG. 2B, elements such as a transistor and a light-emitting element, a conductive layer, and an insulating layer may be provided over a substrate without a bonding layer placed therebetween. In that case, a substrate with heat resistance high enough to withstand the process temperature in the manufacturing process, such as a glass substrate, is used as the substrate 801 and the substrate 803. Then, the insulating layer 812, the transistor 820, and the like are formed directly over the substrate 801. Similarly, the insulating layer 842, the conductive layer 853, and the like are formed directly over the substrate 803.

Specific Example 3 of Cross-Sectional Structure

FIG. 3A illustrates a top-emission light-emitting device using a color filter method, which is different from that in FIG. 2A.

The light-emitting device in FIG. 3A includes the substrate 801, the bonding layer 811, the insulating layer 813, a plurality of transistors, the conductive layer 857, the insulating layer 815, an insulating layer 817*a*, an insulating layer 817*b*, a conductive layer 856, a plurality of light-emitting elements, the insulating layer 821, the bonding layer 822, a spacer 823, the conductive layer 851, an overcoat 849, the insulating layer 852, the conductive layer 853, the coloring layer 845, the light-blocking layer 847, the insulating layer 843, the bonding layer 841, and the substrate 803. The bonding layer 822, the conductive layer 851, the overcoat 849, the insulating layer 852, the insulating layer 843, the bonding layer 841, and the substrate 803 transmit visible light.

The light-emitting device in FIG. 3A includes the spacer 823 over the insulating layer 821. The spacer 823 can adjust the distance between the substrate 801 and the substrate 803.

The first electrode 831 of the light-emitting element 830 is electrically connected to the conductive layer 856 and the source electrode or the drain electrode of the transistor 820.

In the light-emitting device in FIG. 3A, the substrate 801 and the substrate 803 have different sizes. The FPC 808 is positioned over the insulating layer 843 and does not overlap the substrate 803. The connector 825 is connected to the conductive layer 857 through an opening provided in the insulating layer 843, the conductive layer 851, the bonding layer 822, the insulating layer 817*a*, and the insulating layer 815. There is no limitation on the material for the substrate 803 because an opening does not need to be formed in the substrate 803.

In one embodiment of the present invention, the light-emitting element may include the first electrode 831, an optical adjustment layer 832, the EL layer 833, and the second electrode 835 as illustrated in FIG. 3B. The optical adjustment layer 832 is preferably formed using a light-transmitting conductive material.

Owing to the combination of the coloring layer and a microcavity structure (the optical adjustment layer 832), light with high color purity can be extracted from the light-emitting device of one embodiment of the present invention. The thickness of the optical adjustment layer 832 may be varied depending on the color of the pixel. Alternatively, instead of providing the optical adjustment layer 832, optical adjustment may be performed by varying the thickness of the electrode or the EL layer included in the light-emitting element between pixels. Although FIG. 3A shows an example where the light-blocking layer 847 is provided between the coloring layers, the light-blocking layer 847 may not be provided between the coloring layers.

The overcoat 849 covering the light-blocking layer 847 and the coloring layer 845 may be provided. The overcoat 849 may be positioned between the conductive layer 851 and the light-blocking layer 847 or the coloring layer 845. Note that the overcoat 849 is not necessarily provided. The overcoat 849 may be provided only in the light-emitting unit 804, provided in the light-emitting unit 804 and the driver circuit unit 806, or provided on the entire surface over the insulating layer 843. In FIG. 3A, the overcoat 849 is provided in the light-emitting unit 804 and the driver circuit unit 806, and in addition, the conductive layer 851 is provided on the entire surface over the insulating layer 843 and is electrically insulated from the connector 825. These are merely examples, and one embodiment of the present invention is not limited to these examples.

Specific Example 4 of Cross-Sectional Structure

FIG. 4 illustrates a top-emission light-emitting device using a separate coloring method.

The light-emitting device in FIG. 4 includes the substrate 801, the bonding layer 811, the insulating layer 813, a plurality of transistors, the conductive layer 857, the insulating layer 815, the insulating layer 817, a plurality of light-emitting elements, the insulating layer 821, the spacer 823, the bonding layer 822, the conductive layer 851, the insulating layer 852, the conductive layer 853, the insulating layer 843, the bonding layer 841, and the substrate 803. The bonding layer 822, the conductive layer 851, the insulating layer 852, the insulating layer 843, the bonding layer 841, and the substrate 803 transmit visible light.

Examples of Materials

Next, materials that can be used for the light-emitting device will be described. Note that description of the components already described in this specification is omitted in some cases.

For the substrate, glass, quartz, an organic resin, a metal, an alloy, or the like can be used. The substrate through which light from the light-emitting element is extracted is formed using a material that transmits the light.

It is particularly preferable to use a flexible substrate. For example, it is possible to use glass, a metal, or an alloy that is thin enough to have flexibility, or an organic resin.

An organic resin, which has a smaller specific gravity than glass, is preferably used for the flexible substrate, in which case the light-emitting device can be lighter in weight than that using glass.

A material with high toughness is preferably used for the substrate. In that case, a robust light-emitting device with high impact resistance can be provided. For example, when an organic resin substrate or a thin metal or alloy substrate is used, the light-emitting device can be lighter in weight and more robust than that using a glass substrate.

A metal material and an alloy material, which have high thermal conductivity, are preferred because they can easily conduct heat to the whole substrate and accordingly can prevent a local temperature rise in the light-emitting device. The thickness of a substrate using a metal material or an alloy material ranges preferably from 10 μm to 200 μm, more preferably from 20 μm to 50 μm.

Although there is no particular limitation on a material for the metal substrate and the alloy substrate, it is preferable to use, for example, aluminum, copper, nickel, or a metal alloy such as an aluminum alloy or stainless steel.

Furthermore, when a material with high thermal emissivity is used for the substrate, the surface temperature of the light-emitting device can be prevented from rising, leading to prevention of breakage or a decrease in reliability of the light-emitting device. For example, the substrate may have a stacked-layer structure of a metal substrate and a layer with high thermal emissivity (e.g., a layer formed using a metal oxide or a ceramic material).

Examples of a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material with a low coefficient of thermal expansion is preferred, and for example, a polyamide imide resin, a polyimide resin, or PET can be suitably used. It is also possible to use a substrate in which a fibrous body is impregnated with a resin (also referred to as prepreg) or a substrate whose coefficient of thermal expansion is reduced by mixing an organic resin with an inorganic filler.

The flexible substrate may have a stacked-layer structure in which a hard coat layer by which a surface of the device is protected from damage (e.g., a silicon nitride layer), a layer that can disperse pressure (e.g., an aramid resin layer), or the like is stacked over a layer of any of the above-mentioned materials.

The flexible substrate may be formed by stacking a plurality of layers. When a glass layer is used, a barrier property against water and oxygen can be improved and thus a reliable light-emitting device can be provided.

For example, it is possible to use a flexible substrate in which a glass layer, a bonding layer, and an organic resin layer are stacked from the side closer to a light-emitting element. The thickness of the glass layer ranges from 20 µm to 200 µm, preferably from 25 µm to 100 µm. With such a thickness, the glass layer can have both high flexibility and a high barrier property against water and oxygen. The thickness of the organic resin layer ranges from 10 µm to 200 µm, preferably from 20 µm to 50 µm. Providing such an organic resin layer outside the glass layer, occurrence of a crack or a break in the glass layer can be suppressed and mechanical strength can be improved. With the substrate using such a composite material of a glass material and an organic resin, a flexible light-emitting device with high reliability can be provided.

For the bonding layer, a variety of curable adhesives such as a photocurable adhesive (e.g., an ultraviolet curable adhesive), a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. A material with low moisture permeability, such as an epoxy resin, is particularly preferred. Alternatively, a two-component resin may be used. An adhesive sheet or the like may be used.

Furthermore, the resin may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because it can prevent impurities such as moisture from entering the functional element, thereby improving the reliability of the light-emitting device.

When a filler with a high refractive index or a light scattering member is mixed into the resin, the efficiency of light extraction from the light-emitting element can be improved. For example, titanium oxide, barium oxide, zeolite, or zirconium can be used.

There is no particular limitation on the structure of the transistors in the light-emitting device. For example, a forward staggered transistor or an inverted staggered transistor may be used. A top-gate transistor or a bottom-gate transistor may be used. There is no particular limitation on a semiconductor material used for the transistors, and an oxide semiconductor, silicon, germanium, or an organic semiconductor can be used, for example.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

For a semiconductor layer, an element belonging to Group 4, a compound semiconductor, or an oxide semiconductor can be used, for example. Specifically, a semiconductor containing silicon, a semiconductor containing gallium arsenide, or an oxide semiconductor containing indium can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because off-state leakage current of the transistor can be reduced.

For example, the oxide semiconductor preferably contains at least indium (In) or zinc (Zn). More preferably, the oxide semiconductor is In—M—Zn-based oxide (M is a metal such as Al, Ti, Ga, Ge, Y, Zr, Sn, La, Ce, or Hf).

As the semiconductor layer, it is preferable to use an oxide semiconductor film including a plurality of crystal parts. Specifically, the c-axes of the crystal parts are oriented substantially perpendicular to a surface on which the semiconductor layer is formed or the top surface of the semiconductor layer, and adjacent crystal parts have no grain boundary.

Such an oxide semiconductor without grain boundary prevents a crack of an oxide semiconductor film from being caused by stress generated when the light-emitting device is bent. Consequently, such an oxide semiconductor is preferably used for a flexible light-emitting device that is bent when used.

The use of such an oxide semiconductor for the semiconductor layer achieves a highly reliable transistor with little change in the electrical characteristics.

Charge accumulated in a capacitor through a transistor can be retained for a long time because of low off-state current of the transistor. The use of such a transistor in pixels allows a driver circuit to stop while the gray level of an image displayed on display regions of the pixels is maintained. As a result, a light-emitting device with extremely low power consumption is obtained.

Alternatively, silicon is preferably used as a semiconductor in which a channel of a transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon. When such a polycrystalline semiconductor is used for a pixel, the aperture ratio of the pixel can be increased. Even when pixels are provided at very high density, a gate driver circuit and a source driver circuit can be formed over a substrate where the pixels are formed, so that the number of components of an electronic device can be reduced.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by sputtering, chemical vapor deposition (CVD) such as a plasma-enhanced CVD, thermal CVD, or metal organic CVD (MOCVD), atomic layer deposition (ALD), coating, printing, or the like. Note that the base film is not necessarily provided. In each of the above structure examples, the insulating layer 813 can also serve as a base film of the transistor.

As the light-emitting element, a self-luminous element can be used, and an element whose luminance is controlled by current or voltage is included in the category of the light-emitting element. For example, a light-emitting diode (LED), an organic EL element, or an inorganic EL element can be used.

A conductive film that transmits visible light is used for the electrode through which light from the light-emitting element is extracted. A conductive film that reflects visible light is preferably used for the electrode through which light is not extracted.

The conductive film that transmits visible light can be formed using, for example, indium oxide, indium tin oxide (ITO), indium zinc oxide, zinc oxide, or zinc oxide to which gallium is added. It is also possible to use a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) when the film is thin enough to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Moreover, the conductive film can be formed using an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium. An alloy of silver and copper is preferable because of its high heat resistance. When a metal film or a metal oxide film is stacked on an aluminum alloy film, oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, it is possible to use a stacked film of silver and ITO or a stacked film of an alloy of silver and magnesium and ITO.

Each of the electrodes can be formed by an evaporation method or a sputtering method. Alternatively, a discharging method such as an ink-jet method, a printing method such as a screen printing method, or a plating method can be used.

When a voltage higher than the threshold voltage of the light-emitting element is applied between the first electrode 831 and the second electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the EL layer 833, either a low molecular compound or a high molecular compound can be used, and an inorganic compound may be used. Each of the layers included in the EL layer 833 can be formed by any of the following methods: an evaporation method (including a vacuum evaporation method), a transfer method, a printing method, an ink-jet method, a coating method, and the like.

The light-emitting element is preferably provided between a pair of insulating films that are highly resistant to moisture, in which case impurities such as water can be prevented from entering the light-emitting element, thereby preventing a decrease in the reliability of the light-emitting device.

Examples of the insulating film with high resistance to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with high resistance to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

Insulating films with high resistance to moisture are preferably used as the insulating layer 813 and the insulating layer 843.

As each of the insulating layers 812, 815, and 842, an inorganic insulating film such as a silicon oxide film, a silicon oxynitride film, a silicon nitride film, a silicon nitride oxide film, or an aluminum oxide film can be used, for example. For each of the insulating layers 817, 817a, 817b, and 852, an organic material such as polyimide, acrylic, polyamide, polyimide amide, or a benzocyclobutene-based resin can be used, for example. Alternatively, a low dielectric constant material (low-k material) or the like can be used. Furthermore, each of the insulating layers may be formed by stacking a plurality of insulating films.

The insulating layer 821 is formed using an organic insulating material or an inorganic insulating material. As a resin, a polyimide resin, a polyamide resin, an acrylic resin, a siloxane resin, an epoxy resin, or a phenol resin can be used, for example. It is particularly preferable that the insulating layer 821 be formed to have an inclined sidewall with continuous curvature by using a photosensitive resin material.

There is no particular limitation on the method for forming the insulating layer 821. A photolithography method, a sputtering method, an evaporation method, a droplet discharging method (e.g., an ink-jet method), a printing method (e.g., screen printing or off-set printing), or the like may be used.

The spacer 823 can be formed using an inorganic insulating material, an organic insulating material, a metal material, or the like. As the inorganic insulating material and the organic insulating material, a variety of materials that can be used for the aforementioned insulating layers can be used, for example. As the metal material, titanium, aluminum, or the like can be used. When the spacer 823 containing a conductive material and the second electrode 835 are electrically connected to each other, a potential drop due to the resistance of the second electrode 835 can be suppressed. The spacer 823 may have a tapered shape or an inverse tapered shape.

A conductive layer functioning as an electrode of the transistor, a wiring, an auxiliary wiring of the light-emitting element, or the like in the light-emitting device can be formed with a single-layer structure or a stacked-layer structure using any of a metal material such as molybdenum, titanium, chromium, tantalum, tungsten, aluminum, copper, neodymium, and scandium and an alloy material containing any of these elements, for example. The conductive layer may be formed using a conductive metal oxide such as indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials containing silicon oxide.

The coloring layer 845 is a colored layer that transmits light in a specific wavelength range. For example, a red (R) color filter for transmitting light in a red wavelength range, a green (G) color filter for transmitting light in a green wavelength range, and a blue (B) color filter for transmitting light in a blue wavelength range can be used. Each coloring layer is formed in a desired position with any of various materials by a printing method, an ink-jet method, an etching method using photolithography, or the like. The coloring layer can be formed using a metal material, pigment, dye, or the like.

The light-blocking layer 847 is provided between adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using carbon black; a metal oxide; a composite oxide containing a solid solution of a plurality of metal oxides; or a resin material containing a metal material, pigment, or dye. Note that it is preferable to provide the light-blocking layer in a region other than the light-emitting unit, such as the driver circuit unit, in which case undesired leakage of guided light or the like can be suppressed.

The overcoat 849 covering the coloring layer and the light-blocking layer may be provided. The overcoat can prevent impurities and the like contained in the coloring layer from being diffused into the light-emitting element. The overcoat is formed with a material that transmits light emitted from the light-emitting element; for example, it is possible to use an inorganic insulating film such as a silicon nitride film or a silicon oxide film, an organic insulating film such as an acrylic film or a polyimide film, or a stacked layer of an organic insulating film and an inorganic insulating film.

For the connector 825, it is possible to use a paste-like or sheet-like material that is obtained by mixing metal particles into a thermosetting resin and exhibits anisotropic electrical conductivity by thermocompression bonding. As the metal particles, particles in which two or more kinds of metals are layered, for example, nickel particles coated with gold are preferably used.

Note that there is no particular limitation on the light-emitting element included in the light-emitting device of one embodiment of the present invention. In addition, one embodiment of the present invention can also be applied to a display device including a display element.

Note that in this specification and the like, a display element, a display device including a display element, a light-emitting element, and a light-emitting device including a light-emitting element can employ various modes or can include various elements. A display element, a display device, a light-emitting element, or a light-emitting device includes at least one of the following, for example: an EL element (e.g., an EL element including organic and inorganic materials, an organic EL element, and an inorganic EL element), an LED (e.g., a white LED, a red LED, a green LED, and a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator (IMOD) element, a MEMS shutter display element, an optical-interference-type MEMS display element, an electrowetting element, a piezoelectric ceramic display, and a display element using a carbon nanotube. Other than the above, a display medium whose contrast, luminance, reflectance, transmittance, or the like is changed by electric or magnetic action may be included. An example of a display device having EL elements is an EL display. Examples of a display device including electron emitters are a field emission display (FED) and an SED-type flat panel display (SED: surface-conduction electron-emitter display). An example of a display device including liquid crystal elements is a liquid crystal display (e.g., a transmissive liquid crystal display, a transflective liquid crystal display, a reflective liquid crystal display, a direct-view liquid crystal display, and a projection liquid crystal display). An example of a display device using electronic ink, Electronic Liquid Powder (registered trademark), or electrophoretic elements is electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption.

For example, in this specification and the like, it is possible to employ an active matrix method in which an active element (a non-linear element) is included in a pixel or a passive matrix method in which an active element is not included in a pixel.

In the active matrix method, not only a transistor but also a variety of active elements, for example, a metal insulator metal (MIM) or a thin film diode (TFD) can be used. These elements are fabricated with a small number of steps, resulting in low manufacturing cost or high yield. Furthermore, since these elements are small, the aperture ratio can be increased, leading to low power consumption and high luminance.

Since an active element is not used in the passive matrix method, the number of manufacturing steps is small, so that the manufacturing cost can be reduced or the yield can be increased. Furthermore, since an active element is not used, the aperture ratio can be improved, leading to low power consumption or high luminance.

Note that the light-emitting device of one embodiment of the present invention may be used not only as a display device but also as a lighting device. By using the light-emitting device as a lighting device, it can be used for interior lighting having an attractive design or as lighting from which light radiates in various directions. Alternatively, the light-emitting device may be used as a light source such as a backlight or a front light, that is, a lighting device for a display panel.

As described above, in one embodiment of the present invention, providing the light-emitting element with an auxiliary electrode suppresses a voltage drop of the electrode and reduces unevenness in display luminance of the light-emitting device.

In the light-emitting device of one embodiment of the present invention, a conductive film having high wettability to the material of a bonding layer is provided in contact with the bonding layer. Therefore, entry of air bubbles can be prevented when a pair of substrates are attached to each other with the bonding layer, so that the substrates can be attached with a high yield.

This embodiment can be combined with any other embodiment as appropriate.

Embodiment 2

In this embodiment, an input/output device of one embodiment of the present invention will be described with reference to a drawing.

Although this embodiment shows an example in which an organic EL element is used as a light-emitting element, an input/output device of one embodiment of the present invention is not limited to this and may include another light-emitting element or a display element.

This embodiment shows an example in which a capacitive touch sensor is used as a sensor; however, an input/output device of one embodiment of the present invention is not limited to this, and a sensing element included in the sensor is not limited to a capacitor. Moreover, another input device may be used.

Examples of a capacitive touch sensor are a surface capacitive touch sensor and a projected capacitive touch sensor. Examples of a projected capacitive touch sensor are a self-capacitive touch sensor and a mutual capacitive touch sensor. The use of a mutual capacitive type is preferable because multiple points can be sensed simultaneously. Alternatively, a resistive touch sensor, an ultrasonic touch sensor, or an optical touch sensor may be used.

Figure 5A:
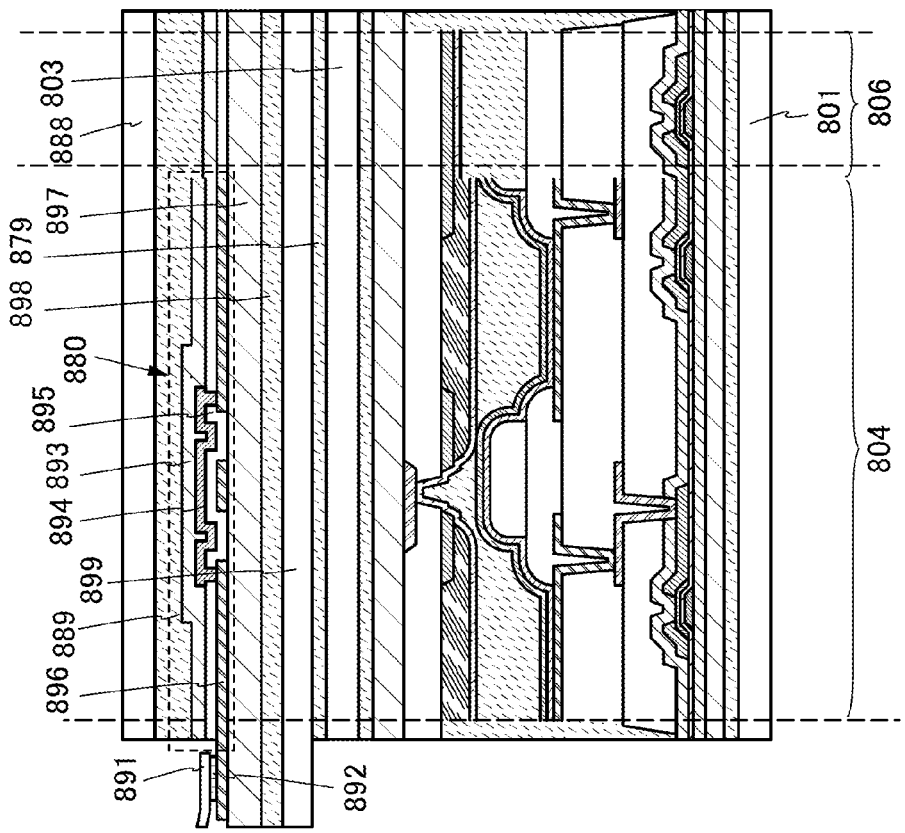
FIGS. 5A and 5B each illustrate an example of an input/output device.
Figure 5B:
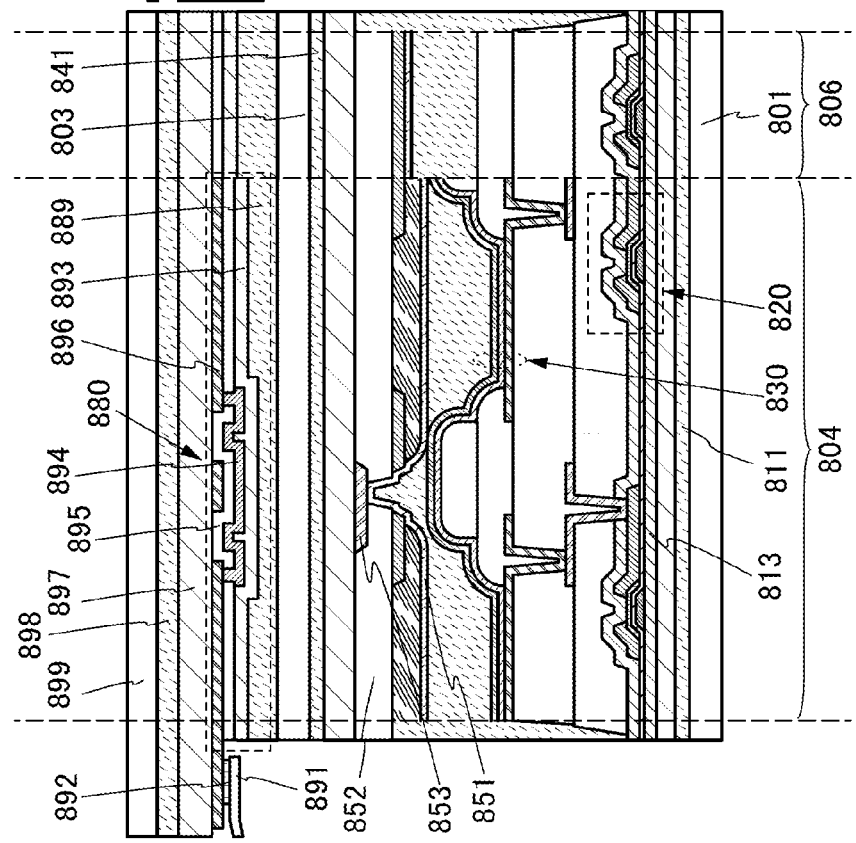

As illustrated in FIGS. 5A and 5B, an input device is attached to the light-emitting device of one embodiment of the present invention, which is shown in Embodiment 1, whereby an input/output device of one embodiment of the present invention can be fabricated.

Light-emitting devices illustrated in FIGS. 5A and 5B each include the bonding layer 811, the insulating layer 813, the transistor 820, the light-emitting element 830, the conductive layer 851, the insulating layer 852, the conductive layer 853, the bonding layer 841, and the like between the substrate 801 and the substrate 803. Specific Example 3 of Cross-sectional Structure (FIG. 3A) in Embodiment 1 can be referred to for a specific structure of the light-emitting devices. Note that the light-emitting devices of FIGS. 5A and 5B differ from that of FIG. 3A in not including the overcoat 849.

In input devices illustrated in FIGS. 5A and 5B, a substrate 899 and an insulating layer 897 are attached to each other with a bonding layer 898, and a capacitor 880 is provided over the insulating layer 897 as a sensing element. The capacitor 880 includes a plurality of conductive layers 896, a conductive layer 894 connected to the conductive layers 896, and an insulating layer 895 between the conductive layers 896 and the conductive layer 894. The conductive layers 896 are electrically connected to each other through the conductive layer 894. The capacitor 880 may be covered with an insulating layer 893. The conductive layer 896 is electrically connected to an FPC 891 through a connector 892.

FIG. 5A illustrates an example where the insulating layer 893 is attached to the substrate 803 with a bonding layer 889 placed therebetween. In this manner, the input/output device may include three substrates 801, 803, and 899.

FIG. 5B illustrates an example where the insulating layer 893 is attached to a substrate 888 with the bonding layer 889 placed therebetween, and the substrate 899 is attached to the substrate 803 with a bonding layer 879 placed therebetween. In this manner, the input/output device may include four substrates 801, 803, 888, and 899.

As materials used for the input device, it is possible to use materials for the substrate, insulating layer, bonding layer, conductive layer, connector, and the like of the light-emitting device in Embodiment 1. Note that layers overlapping a light-emitting region of the light-emitting element (here, the substrate 899, the bonding layer 898, the insulating layer 897, the conductive layer 896, the insulating layer 895, the insulating layer 893, the bonding layer 889, the substrate 888, and the bonding layer 879) are formed using a material that transmits light from the light-emitting element. A layer that does not overlap the light-emitting region of the light-emitting element (e.g., the conductive layer 894) does not necessarily have transmittance.

This embodiment can be combined with any other embodiment as appropriate.

Embodiment 3

In this embodiment, an input/output device of one embodiment of the present invention will be described with reference to drawings.

Although this embodiment shows an example in which an organic EL element is used in a display portion, an input/output device of one embodiment of the present invention is not limited to this and may include another light-emitting element or a display element in a display portion.

This embodiment shows an example where an input device is a touch sensor including a sensing element (e.g., a capacitor) and an active electrode (e.g., a transistor) in each sensing unit (such a touch sensor is also referred to as an active matrix touch sensor). In this embodiment, a capacitor is used as a sensing element as an example; however, an input/output device of one embodiment of the present invention is not limited to this and may include another sensing element such as a light-receiving element or another input device.

The input/output device of one embodiment of the present invention includes an active matrix touch sensor and a display element between a pair of substrates. The touch sensor included in the input/output device of one embodiment of the present invention is a capacitive touch sensor, for example.

In the input/output device including a sensor portion and a display portion that overlap with each other, parasitic capacitance is sometimes generated between a wiring or an electrode included in the capacitive touch sensor and a wiring or an electrode included in the display portion. The parasitic capacitance might cause a capacitance change to be decreased when a finger or the like approaches the touch sensor, resulting in a decrease in the detection sensitivity of the touch sensor. The detection sensitivity of the touch sensor might be decreased also when noise generated while the display element operates travels to the touch sensor through the parasitic capacitance.

By sufficiently increasing the distance between the sensor portion and the display portion, the adverse effect of the parasitic capacitance and the noise can be avoided and the decrease in the detection sensitivity of the touch sensor can be suppressed; however, the thickness of the whole input/output device is increased in some cases.

In the input/output device of one embodiment of the present invention, an active matrix touch sensor is used. The touch sensor includes a transistor and a capacitor. The transistor and the capacitor are electrically connected to each other.

In the active matrix touch sensor, an electrode of the capacitor and a read wiring can be formed in different layers. When the read wiring has a narrow width, parasitic capacitance can be small. Accordingly, a decrease in the detection sensitivity of the touch sensor can be suppressed.

Furthermore, generation of parasitic capacitance might decrease the amplitude of a detection signal and decrease the detection sensitivity. In one embodiment of the present invention, a detection signal is amplified and the amplified signal is output; thus, the adverse effect of the parasitic capacitance can be suppressed.

In one embodiment of the present invention, the use of an active matrix touch sensor can reduce the distance between the sensor portion and the display portion and thin the input/output device. Moreover, the touch sensor and the display element can be located between two substrates, whereby the input/output device can have a small thickness. Here, the use of the active matrix touch sensor can suppress a decrease in the detection sensitivity of the touch sensor even when the distance between the sensor portion and the display portion is reduced. Therefore, in one embodiment of the present invention, both thinness and high detection sensitivity of the touch sensor or the input/output device can be achieved. Furthermore, by using a flexible material for the pair of substrates, the input/output device can have flexibility. In addition, one embodiment of the present invention can provide an input/output device with high resistance to repeated bending or a large-size input/output device.

In the touch sensor included in the input/output device of one embodiment of the present invention, an oxide conductor layer may be used for the electrode of the capacitor. In the active matrix touch sensor, a semiconductor layer and a conductive film of the transistor and the electrode of the capacitor are preferably formed in the same step. Thus, the number of steps for fabricating the input/output device can be reduced, and the fabrication cost can be reduced.

When the oxide conductor layer is used as the electrode of the capacitor, the input/output device of one embodiment of the present invention sometimes has smaller viewing angle dependence and a higher NTSC ratio than an input/output device using another material as a capacitor electrode.

Specifically, one embodiment of the present invention is an input/output device including a touch sensor, a light-blocking layer, and a display element between a pair of electrodes. The light-blocking layer is located between the touch sensor and the display element and includes a portion overlapping with a transistor included in the touch sensor. The display element includes a portion overlapping with a capacitor included in the touch sensor.

The display element can be, but is not particularly limited to, an organic EL element. Therefore, in the above structure, the display element may include a first electrode, a second electrode, and a layer containing a light-emitting organic compound. An insulating film covering an end portion of the first electrode may be provided. The layer containing a light-emitting organic compound may be located between the first electrode and the second electrode. The insulating film may include a portion overlapping with the transistor included in the touch sensor.

Structure Example of Input/Output Device

Figure 6A:
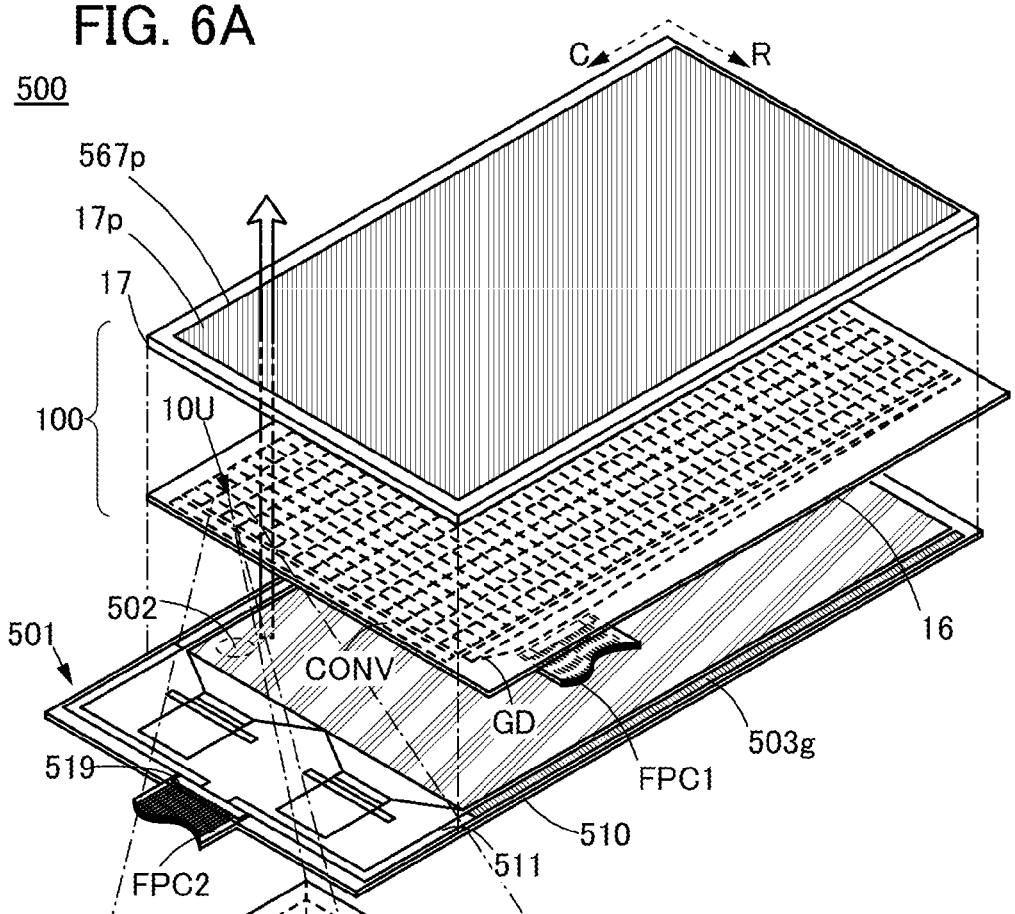
FIGS. 6A and 6B illustrate an example of an input/output device.
Figure 6B:
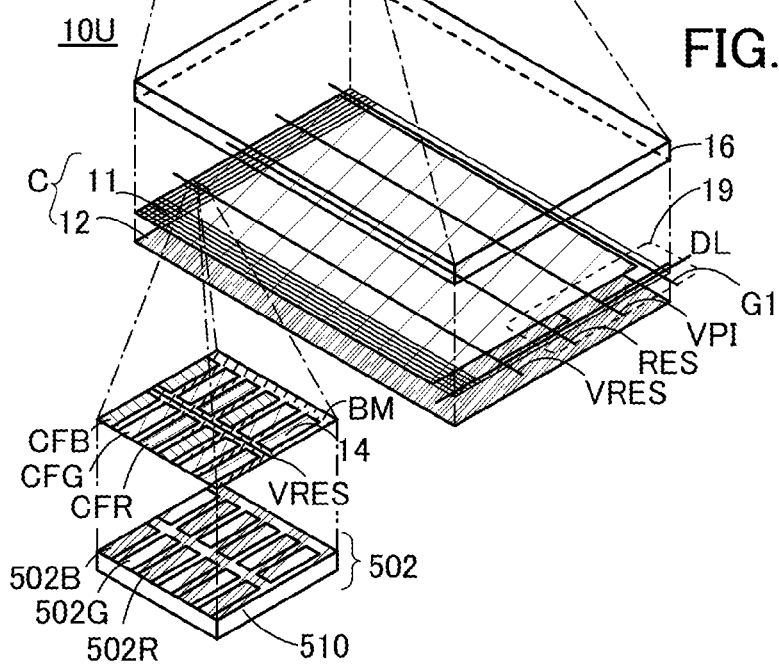

FIGS. 6A and 6B are projection views illustrating a structure of an input/output device of one embodiment of the present invention.

FIG. 6A is a projection view of an input/output device 500 of one embodiment of the present invention. FIG. 6B is a projection view illustrating a structure of a sensing unit 10U included in the input/output device 500.

The input/output device 500 described in this embodiment includes an input portion 100 and a display portion 501.

The input portion 100 has flexibility. The input portion 100 includes a scan line G1, a signal line DL, a flexible substrate 16, and a plurality of sensing units 10U. The sensing unit 10U shown in FIG. 6B is provided with window portions 14 that transmit visible light. The sensing units 10U are arranged in a matrix. The scan line G1 is electrically connected to a plurality of sensing units 10U located in the row direction (indicated by the arrow R in the drawing). The signal line DL is electrically connected to a plurality of sensing units 10U located in the column direction (indicated by the arrow C in the drawing). The flexible substrate 16 supports the sensing units 10U, the scan line G1, and the signal line DL.

The display portion 501 includes a flexible substrate 510 and a plurality of pixels 502. The plurality of pixels 502 overlap with the window portion 14 and are arranged in a matrix. The flexible substrate 510 supports the plurality of pixels 502 (FIGS. 6A and 6B).

The sensing unit 10U includes a sensing element C overlapping with the window portion 14 and a sensing circuit 19 electrically connected to the sensing element C (FIG. 6B).

In the sensing element C, an insulating layer is provided between a pair of electrodes that are a first electrode 11 and a second electrode 12 in this embodiment.

The sensing circuit 19 receives a selection signal and supplies a sensing signal DATA based on the change in the capacitance of the sensing element C or parasitic capacitance.

The scan line G1 can supply the selection signal. The signal line DL can supply the sensing signal DATA. The sensing circuit 19 is located to overlap with a gap between the window portions 14.

In addition, the input/output device 500 described in this embodiment includes a coloring layer between the sensing unit 10U and the pixel 502 overlapping with the window portion 14 of the sensing unit 10U.

The input/output device 500 in this embodiment includes the flexible input portion 100 including the plurality of sensing units 10U each having the window portions 14 transmitting visible light, and the flexible display portion 501 including the plurality of pixels 502 overlapping with the window portions 14. The coloring layer is included between the window portion 14 and the pixel 502.

With such a structure, the input/output device can supply a sensing signal based on the change in the capacitance or the parasitic capacitance and positional information of the sensing unit supplying the sensing signal, can display image data relating to the positional information of the sensing unit, and can be bent. As a result, a novel input/output device with high convenience or high reliability can be provided.

The input/output device 500 may include a flexible substrate FPC1 (hereinafter simply referred to as FPC1) supplied with a signal from the input portion 100 and/or a flexible substrate FPC2 (hereinafter simply referred to as FPC2) supplying a signal including image data to the display portion 501.

The input/output device 500 may be provided with a protective layer 17p that protects the input/output device 500 from scratches and/or an antireflective layer 567p that reduces the intensity of external light the input/output device 500 reflects.

The input/output device 500 also includes a scan line driver circuit 503g that supplies a selection signal to a scan line of the display portion 501 and a terminal 519 electrically connected to FPC2 and a wiring 511 that supplies a signal.

Individual components included in the input/output device 500 will be described below. Note that these components cannot be clearly distinguished, and one component also serves as another component or includes part of another component in some cases.

For example, the input portion 100 provided with coloring layers overlapping with the window portions 14 also serves as a color filter.

Furthermore, for example, the input/output device 500 in which the input portion 100 overlaps the display portion 501 serves as the display portion 501 as well as the input portion 100.

The input portion 100 includes a plurality of sensing units 10U and the flexible substrate 16 supporting the sensing units 10U. For example, the plurality of sensing units 10U are arranged in a matrix over the flexible substrate 16.

The window portion 14 transmits visible light.

For example, the window portion 14 may be formed by overlapping the flexible substrate 16, the sensing element C, and a flexible protective base material 17 so as not to prevent transmission of visible light.

For instance, an opening may be provided in a material that does not transmit visible light. Specifically, one or a plurality of openings having any of a variety of shapes such as a rectangle may be provided.

Coloring layers that transmit light of a predetermined color are provided so as to overlap with the window portions 14. For example, a coloring layer CFB transmitting blue light, a coloring layer CFG transmitting green light, and a coloring layer CFR transmitting red light are provided (FIG. 6B).

In addition to the coloring layers transmitting blue light, green light, and/or red light, coloring layers transmitting light of various colors such as white and yellow can be provided.

A light-blocking layer BM is provided to surround the window portions 14. The light-blocking layer BM is less likely to transmit light than the window portion 14. Note that in this specification and the like, a black matrix is used as the light-blocking layer, and the letter symbol BM is used to denote the light-blocking layer.

The scan line G1, the signal line DL, a wiring VPI, a wiring RES, a wiring VRES, and the sensing circuit 19 can be provided to overlap with the light-blocking layer BM.

Note that a light-transmitting overcoat covering the coloring layers and the light-blocking layer BM can be provided.

The flexible protective base material 17 and/or the protective layer 17p can be provided. The flexible protective base material 17 and/or the protective layer 17p protects) the input portion 100 by preventing damage.

For example, a resin film, a resin plate, or a stack of polyester, polyolefin, polyamide, polyimide, polycarbonate, or an acrylic resin can be used as the protective base material 17.

For example, a hard coat layer or a ceramic coat layer can be used as the protective layer 17p. Specifically, a layer containing a UV curable resin or aluminum oxide may be formed to overlap with the second electrode.

The display portion 501 includes a plurality of pixels 502 arranged in a matrix (see FIG. 6B).

For example, the pixel 502 includes a sub-pixel 502B, a sub-pixel 502G, and a sub-pixel 502R, and each sub-pixel includes a display element and a pixel circuit for driving the display element.

Note that the sub-pixel 502B in the pixel 502 is positioned so as to overlap with the coloring layer CFB, the sub-pixel 502G is positioned so as to overlap with the coloring layer CFG, and the sub-pixel 502R is positioned so as to overlap with the coloring layer CFR.

In this embodiment, an example of using an organic EL element that emits white light as a display element is described; however, the display element is not limited to such an element and can be the light-emitting element or the display element exemplified in Embodiment 1.

The display portion 501 includes the wirings 511 through which signals can be supplied. The wirings 511 are provided with the terminal 519. Note that FPC2 through which signals such as an image signal and a synchronization signal can be supplied is electrically connected to the terminal 519.

Note that a printed wiring board (PWB) may be attached to FPC2.

The sensing element C includes the first electrode 11, the second electrode 12, and an insulating layer between the first electrode 11 and the second electrode 12.

The first electrode 11 is formed apart from other regions, for example, is formed into an island shape. Preferably, a layer that can be formed in the same step as that of the first electrode 11 is placed close to the first electrode 11 so that the user of the input/output device 500 does not recognize the first electrode 11. More preferably, the number of window portions 14 provided in the gap between the first electrode 11 and the layer placed close to the first electrode 11 is reduced as much as possible. It is particularly preferred that the window portions 14 not be provided in the gap.

The second electrode 12 is provided to overlap with the first electrode 11, and the insulating layer is provided between the first electrode 11 and the second electrode 12.

For example, when an object whose dielectric constant is different from that of the air gets closer to the first electrode 11 or the second electrode 12 of the sensing element C in the air, capacitance is formed and serves as parasitic capacitance of a circuit. Specifically, when a finger or the like gets closer to one electrode of the sensing element C, capacitance is formed between the one electrode and the finger or the like. Then, the formed capacitance serves as parasitic capacitance of a circuit that is electrically connected to the sensing element C, and the operation of the sensing circuit is changed. Accordingly, the sensing element C can be used in a proximity sensor.

For example, the capacitance of the sensing element C that can change its form varies with the change in the form of the sensing element C.

Specifically, when a finger or the like is in contact with the sensing element C and the gap between the first electrode 11 and the second electrode 12 becomes small, the capacitance of the sensing element C increases. Accordingly, the sensing element C can be used in a tactile sensor and thus can sense writing pressure, for instance.

Specifically, when the sensing element C is folded, the gap between the first electrode 11 and the second electrode 12 becomes small; thus, the capacitance of the sensing element C increases. Accordingly, the sensing element C can be used in a bend sensor.

The first electrode 11 and the second electrode 12 contain a conductive material.

The first electrode 11 and the second electrode 12 can be formed using an inorganic conductive material, an organic conductive material, metal, or conductive ceramics, for example.

Specifically, it is possible to use a metal element selected from aluminum, chromium, copper, tantalum, titanium, molybdenum, tungsten, nickel, silver, and manganese; an alloy containing any of the metal elements; an alloy containing any of the metal elements in combination; or the like.

Alternatively, it is possible to use conductive oxide such as indium oxide, indium tin oxide, indium zinc oxide, zinc oxide, or zinc oxide to which gallium is added.

Alternatively, graphene or graphite can be used. A film containing graphene can be formed, for example, by reducing a film containing graphene oxide. Examples of a reducing method are a method using heat and a method using a reducing agent.

Alternatively, a conductive polymer can be used.

The sensing circuit 19 includes transistors. Moreover, the sensing circuit 19 may include wirings that supply a power supply potential and a signal, such as the signal line DL, the wiring VPI, a wiring CS, the scan line G1, the wiring RES, and the wiring VRES.

Note that the sensing circuit 19 may be provided so as not to overlap with the window portions 14. For example, when a wiring is located not to overlap with the window portion 14, one side of the sensing unit 10U can be visually recognized easily from the other side of the sensing unit 10U.

A variety of circuits that can convert the sensing signal DATA supplied from the sensing unit 10U and supply the converted signal to FPC1 can be used as a converter CONV (FIG. 6A).

Structure Example of Input Portion

FIGS. 7A, 7B, 7C1, and 7C2 are diagrams for explaining a structure of the input portion 100 in one embodiment of the present invention.

Figure 8A:
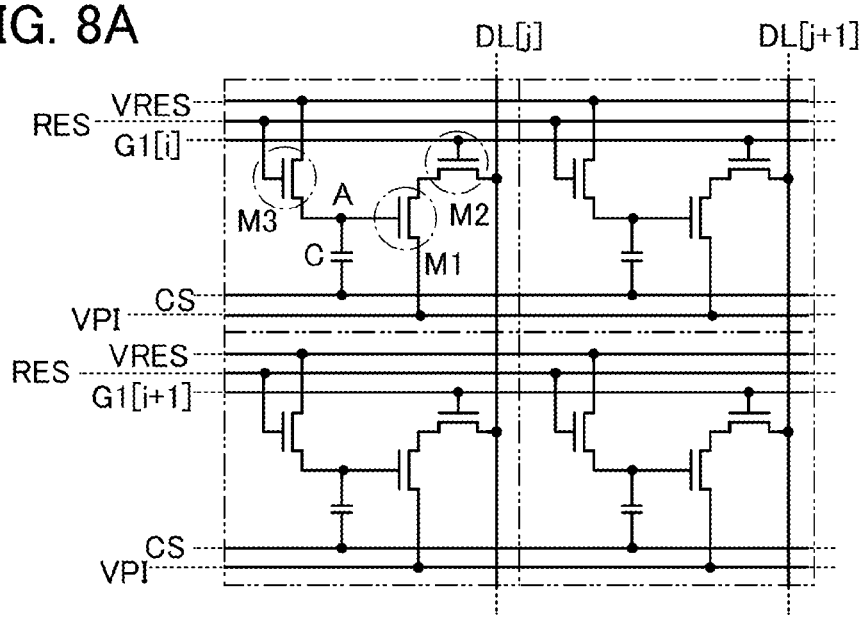
FIGS. 8A to 8C illustrate an example of a sensing circuit.

FIG. 7A is a block diagram illustrating the structure of the input portion 100 in one embodiment of the present invention. FIG. 7B is a circuit diagram illustrating configurations of the converter CONV and the sensing unit 10U. FIGS. 7C1 and 7C2 are timing charts for explaining a method for driving the sensing unit 10U. FIG. 8A is a circuit diagram illustrating the sensing units 10U arranged in a matrix.

The input portion 100 described in this embodiment includes a plurality of sensing units 10U arranged in a matrix, scan lines G1 electrically connected to sensing units 10U arranged in the row direction, signal lines DL electrically connected to sensing units 10U arranged in the column direction, and the flexible substrate 16 provided with the sensing units 10U, the scan lines G1, and the signal lines DL (FIG. 7A).

For example, the plurality of sensing units 10U can be arranged in a matrix of n rows and m columns (n and m are each a natural number of 1 or more).

The sensing unit 10U includes the sensing element C having the second electrode 12 electrically connected to the wiring CS; thus, the potential of the second electrode 12 of the sensing element C can be controlled using a control signal supplied through the wiring CS.

The sensing unit 10U includes a first transistor M1 in which a gate is electrically connected to the first electrode 11 of the sensing element C and a first electrode is electrically connected to the wiring VPI (FIG. 7B). The wiring VPI can supply a ground potential, for example.

The sensing unit 10U may include a second transistor M2 in which a gate is electrically connected to the scan line G1, a first electrode is electrically connected to a second electrode of the first transistor M1, and a second electrode is electrically connected to the signal line DL. The scan line G1 can supply a selection signal. The signal line DL can supply the sensing signal DATA, for example.

The sensing unit 10U may include a third transistor M3 in which a gate is electrically connected to the wiring RES, a first electrode is electrically connected to the first electrode 11 of the sensing element C, and a second electrode is electrically connected to the wiring VRES. The wiring RES can supply a reset signal. The wiring VRES can supply, for example, a potential capable of turning on the first transistor M1.

The capacitance of the sensing element C is changed when an object comes close to the first electrode 11 or the second electrode 12 or when the distance between the first electrode 11 and the second electrode 12 is changed, for example. Thus, the sensing unit 10U can supply the sensing signal DATA based on a change in the capacitance of the sensing element C or parasitic capacitance.

The sensing unit 10U includes the wiring CS that can supply a control signal capable of controlling the potential of the second electrode 12 of the sensing element C. Note that the second electrode 12 may also serve as the wiring CS of the sensing circuit.

A node where the first electrode 11 of the sensing element C, the gate of the first transistor M1, and the first electrode of the third transistor M3 are electrically connected is referred to as a node A.

The wiring VRES can supply a predetermined potential. For example, the wiring VRES can provide the gate of the transistor included in the sensing unit 10U with a potential for turning on the transistor. The wiring VPI can supply a ground potential, for example. A wiring VPO and a wiring BR can supply, for example, a high power supply potential sufficient to turn on a transistor.

The wiring RES can supply a reset signal. The scan line G1 can supply a selection signal. The wiring CS can supply a control signal for controlling the potential of the second electrode 12 of the sensing element C.

The signal line DL can supply the sensing signal DATA. A terminal OUT can supply a signal obtained by conversion based on the sensing signal DATA.

A driver circuit GD can supply a selection signal at given timings, for example. The converter CONV has a conversion circuit. A variety of circuits that can convert the sensing signal DATA and supply the resulting signal to the terminal OUT can be used for the converter CONV. For example, a source follower circuit or a current mirror circuit may be configured by electrically connecting the converter CONV to the sensing unit 10U.

Specifically, a source follower circuit can be configured with the converter CONV using a transistor M4 (FIG. 7B). Note that the transistor M4 may be a transistor that can be fabricated in the same steps as the first to third transistors M1 to M3.

Figure 8B:
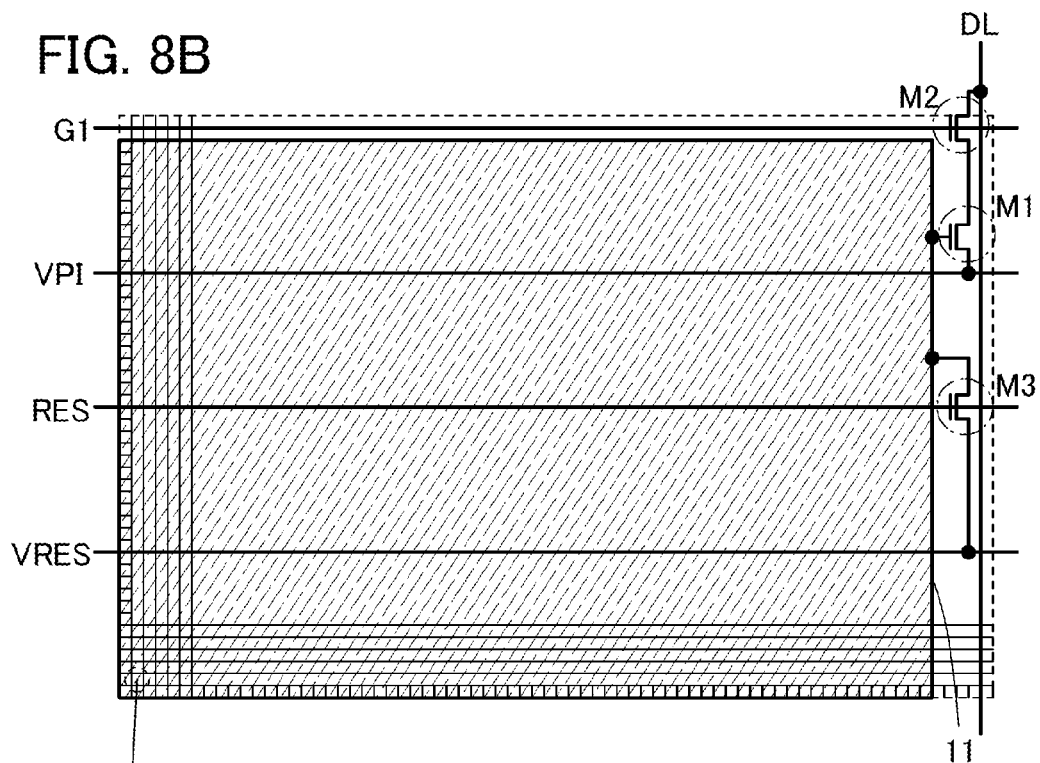
Figure 8C:
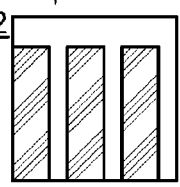

As described above, in the active matrix touch sensor of one embodiment of the present invention, the electrode of the sensing element and the read wiring can be formed in different layers. As shown in FIG. 8B, the first electrode 11 and the signal line DL are formed in different layers and the width of the signal line DL is made small, whereby parasitic capacitance can be reduced. Consequently, a decrease in the detection sensitivity of the touch sensor can be suppressed. Here, an example is shown in which the first electrode 11 overlaps with a plurality of pixels 502 shown in an enlarged view of FIG. 8C. The second electrode 12 that serves as the other electrode of the capacitor (the sensing element C) and is not shown in FIG. 8B has a potential equal to that of the wiring CS (or the second electrode 12 corresponds to the wiring CS).

Example of Method for Driving Input Portion

A method for driving the input portion will be described.
<<First Step>>
In a first step, a reset signal for turning on the third transistor M3 and subsequently turning off the third transistor M3 is supplied to the gate of the third transistor M3, and a potential of the first electrode 11 of the sensing element C is set at a predetermined potential (see Period T1 in FIG. 7C1).

Specifically, a reset signal is supplied from the wiring RES. The third transistor M3 supplied with the reset signal makes the node A have a potential capable of turning on the first transistor M1, for example (FIG. 7B).
<<Second Step>>
In a second step, a selection signal for turning on the second transistor M2 is supplied to the gate of the second transistor M2, and the second electrode of the first transistor M1 is made electrically connected to the signal line DL.

Specifically, a selection signal is supplied from the scan line G1. The second transistor M2 supplied with the selection signal electrically connects the second electrode of the first transistor M1 to the signal line DL (see Period T2 in FIG. 7C1).
<<Third Step>>
In a third step, a control signal is supplied to the second electrode 12 of the sensing element C, and a potential that varies depending on the control signal and the capacitance of the sensing element C is supplied to the gate of the first transistor M1.

Specifically, a rectangular control signal is supplied from the wiring CS. With supply of the rectangular control signal to the second electrode 12, the potential of the node A rises depending on the capacitance of the sensing element C (see the latter half of Period T2 in FIG. 7C1).

For example, when the sensing element C is placed in the air and an object with a higher dielectric constant than the air comes close to the second electrode 12 of the sensing element C, the apparent capacitance of the sensing element C increases.

Consequently, a change in the potential of the node A due to a rectangular control signal is smaller than that when an object with a higher dielectric constant than the air is not placed close to the first electrode of the sensing element C (see a solid line in FIG. 7C2).
<<Fourth Step>>
In a fourth step, a signal based on a change in the gate potential of the first transistor M1 is supplied to the signal line DL.

For example, a current that is changed on the basis of a change in the gate potential of the first transistor M1 is supplied to the signal line DL.

The converter CONV converts a change in current flowing through the signal line DL into a change in voltage and outputs the voltage.
<<Fifth Step>>
In a fifth step, a selection signal for turning off the second transistor M2 is supplied to the gate of the second transistor M2.

The first to fifth steps are repeated for every row of the scan lines G1(1) to G1(n).

Specific Example of Conductive Layer 853 in Input/Output Device

In one embodiment of the present invention, a first electrode, an EL layer, and a second electrode are formed in this order over a first substrate, and an active matrix touch sensor (e.g., a sensing element and a sensing circuit) is formed over a second substrate. Moreover, a second conductive layer (the conductive layer 853), an insulating layer, and a first conductive layer (the conductive layer 851) are formed in this order over the second substrate. In this structure, the first conductive layer and the second conductive layer are electrically connected to each other through an opening in the insulating layer. Moreover, the first substrate and the second substrate face each other so that the second electrode and the first conductive layer are connected to each other. Thus, the first conductive layer, the second conductive layer, and the second electrode can be electrically connected to each other.

In this manner, the conductive layer formed on the second substrate side is electrically connected to the second electrode of the light-emitting element formed over the first substrate, whereby the conductive layer can increase the conductivity of the second electrode. This structure can suppress a potential drop due to the resistance of the second electrode and suppress unevenness in display luminance even in an input/output device including a large-area display portion or an input/output device including a top-emission light-emitting unit. Moreover, the auxiliary electrode protects the light-emitting element from damage, so that the input/output device can have high reliability.

In the above structure, at least one of the first conductive layer and the second conductive layer is preferably formed using the same material and the same step as those of at least one conductive layer (e.g., a wiring or an electrode of the transistor or the sensing element) included in the active matrix touch sensor (specifically, the input portion 100, for example). Similarly, the insulating layer placed between the first and second conductive layers is preferably formed using the same material and the same step as those of at least one insulating layer included in the active matrix touch sensor. Accordingly, an auxiliary wiring of the light-emitting element can be formed without an increase in the number of steps. For the details of the first and second conductive layers, the description of Embodiment 1 can also be referred to.

Figure 9A:
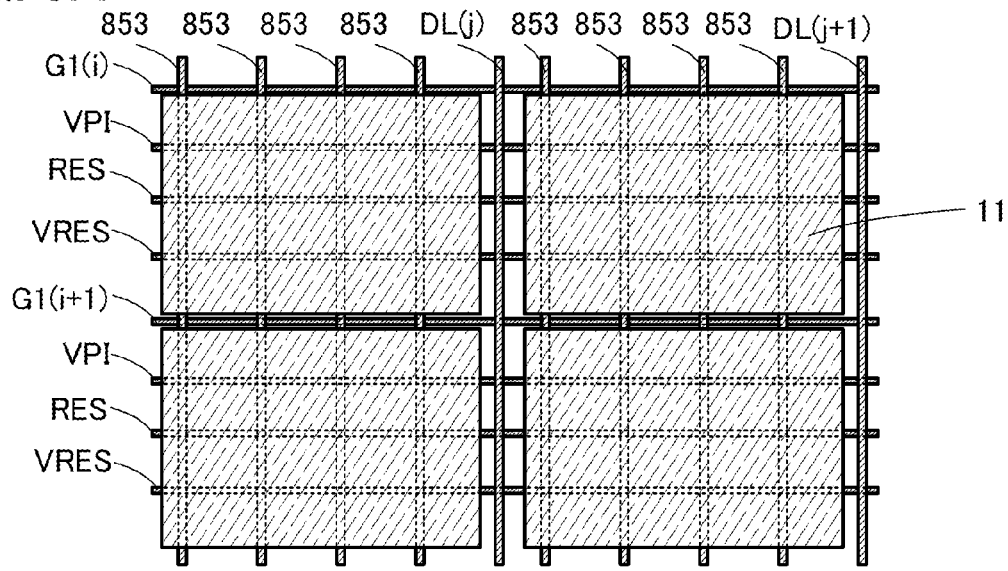
FIGS. 9A to 9D illustrate configurations of an input/output device.
Figure 9B:
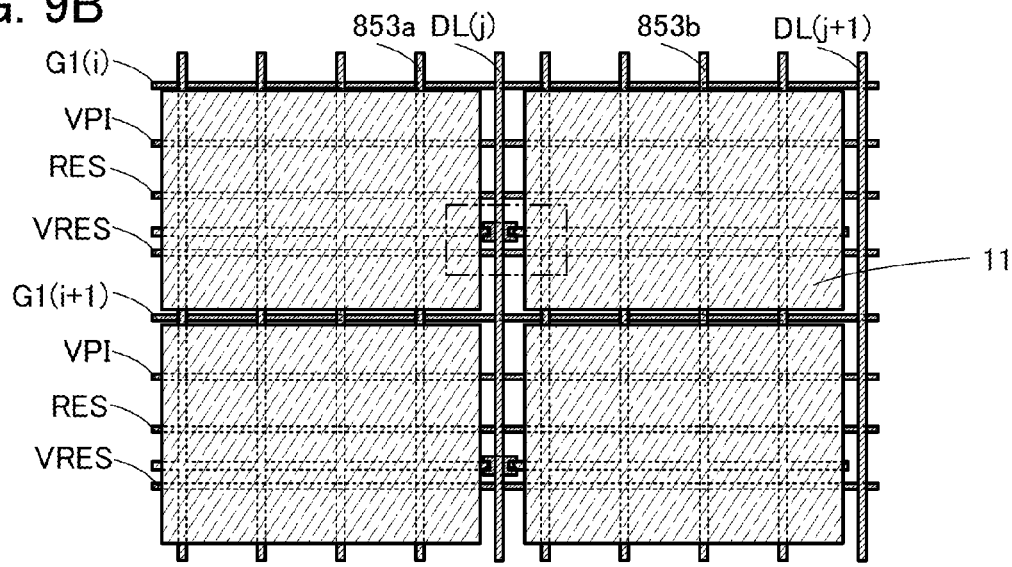

For example, as illustrated in FIGS. 9A and 9B, at least one conductive layer 853 can be formed using the same material and the same step as those of the signal line DL. Note that transistors are not shown in FIGS. 9A and 9B. For instance, a source electrode and a drain electrode of a transistor can be formed using the same material and the same step as those of the signal line DL. For another instance, a gate electrode of the transistor can be formed using the same material and the same step as those of the scan line G1, the wiring VPI, the wiring RES, and the wiring VRES.

When the conductive layer 853 is electrically insulated from the first electrode 11 of the sensing element C with an insulating layer placed therebetween, the conductive layer 853 may be provided to overlap with the sensing element C. In this case, it is preferred that the conductive layer 853 not overlap with a display region of a pixel.

Figure 9C:
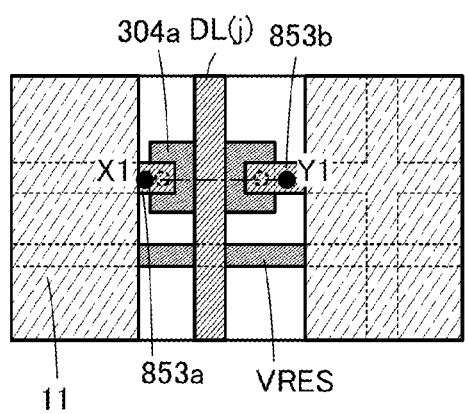
Figure 9D:
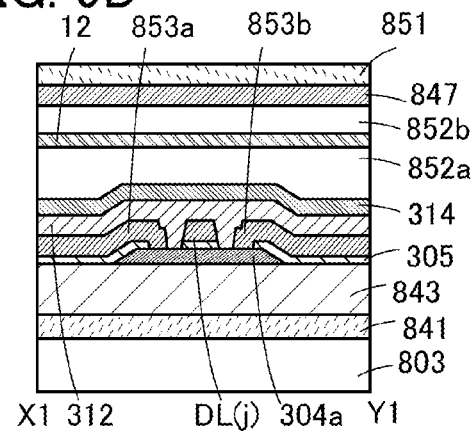

FIG. 9C is an enlarged view of a region indicated by a dashed-dotted line in FIG. 9B. FIG. 9D is a cross-sectional view along dashed-dotted line X1-Y1 in FIG. 9C.

As illustrated in FIGS. 9B to 9D, a conductive layer 853*a* and a conductive layer 853*b* that are separated by the signal line DL may be electrically connected to each other through a conductive layer 304*a*. At least one conductive layer 304*a* can be formed using the same material and the same step as those of the scan line G1, the wiring VPI, the wiring RES, and the wiring VRES.

In the cross-sectional view in FIG. 9D, the substrate 803, the bonding layer 841, the insulating layer 843, and the conductive layer 304*a* are stacked in this order. The conductive layer 304*a* is electrically connected to the conductive layers 853*a* and 853*b* in an opening in a gate insulating layer 305. The conductive layers 853*a* and 853*b* are electrically insulated from a signal line DL(j) by the gate insulating layer 305 and/or an insulating layer 312. The insulating layer 312, an insulating layer 314, an insulating layer 852*a*, the second electrode 12, an insulating layer 852*b*, the light-blocking layer 847, and the conductive layer 851 are stacked in this order over the signal line DL(j) and the conductive layers 853*a* and 853*b*. A structure of a contact portion for connecting the conductive layer 851 and the conductive layers 853*a* and 853*b* will be described below.

Figure 10A:
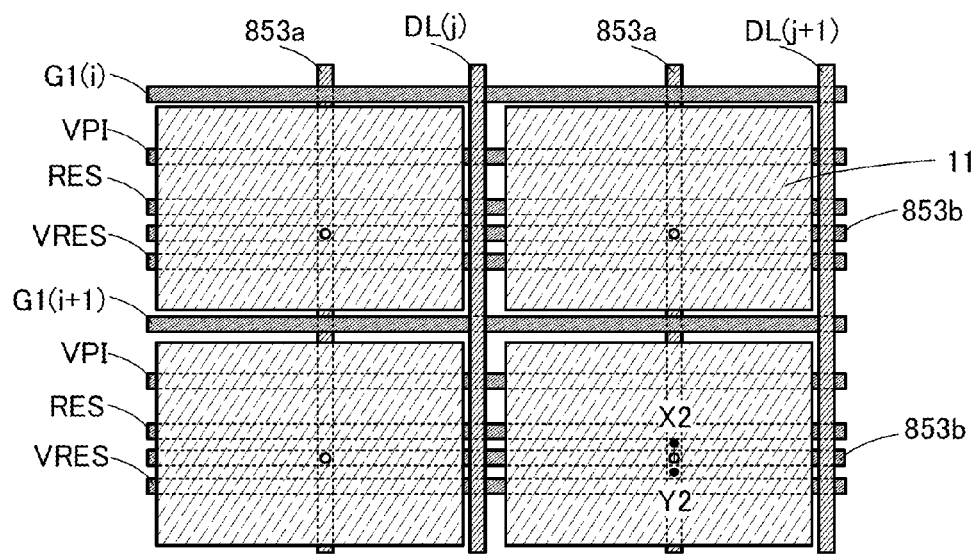
FIGS. 10A to 10C illustrate configurations of an input/output device.

As illustrated in FIG. 10A, it is possible to provide at least one conductive layer 853*a* formed using the same material and the same step as those of the signal line DL, and at least one conductive layer 853*b* formed using the same material and the same step as those of the scan line G1, the wiring VPI, the wiring RES, and the wiring VRES. Note that transistors are not shown in FIG. 10A. The conductive layers 853*a* and 853*b* electrically connected to each other have a function similar to that of the conductive layer 853.

Figure 10B:
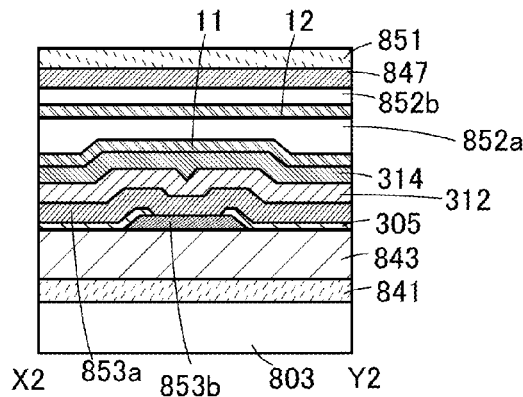

FIG. 10B is a cross-sectional view along dashed-dotted line X2-Y2 in FIG. 10A.

In the cross-sectional view in FIG. 10B, the substrate 803, the bonding layer 841, the insulating layer 843, and the conductive layer 853*b* are stacked in this order. The conductive layer 853*b* is electrically connected to the conductive layer 853*a* in an opening in the gate insulating layer 305. The insulating layer 312, the insulating layer 314, the first electrode 11, the insulating layer 852*a*, the second electrode 12, the insulating layer 852*b*, the light-blocking layer 847, and the conductive layer 851 are stacked in this order over the conductive layer 853*a*.

Figure 10C:
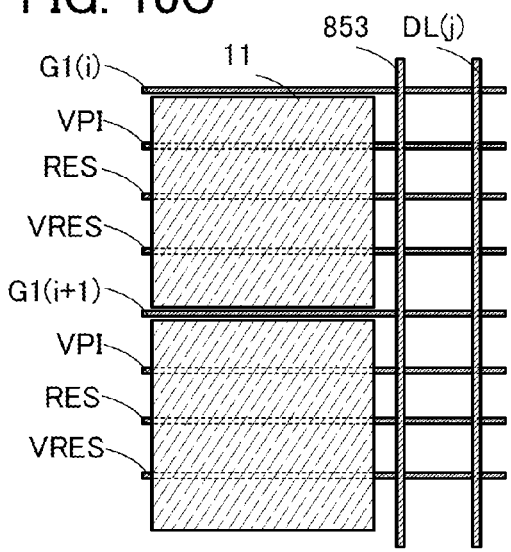

A structure in FIG. 10C where the conductive layer 853 does not overlap with the first electrode 11 of the sensing element C is another embodiment of the present invention. In this structure, there is no particular limitation on the vertical positional relation between the conductive layer 853 and the first electrode 11 in the direction perpendicular to the top face of the top view in FIG. 10C. Note that transistors are not shown in FIG. 10C.

Specific Example 1 of Cross-Sectional Structure of Input/Output Device

Figure 11A:
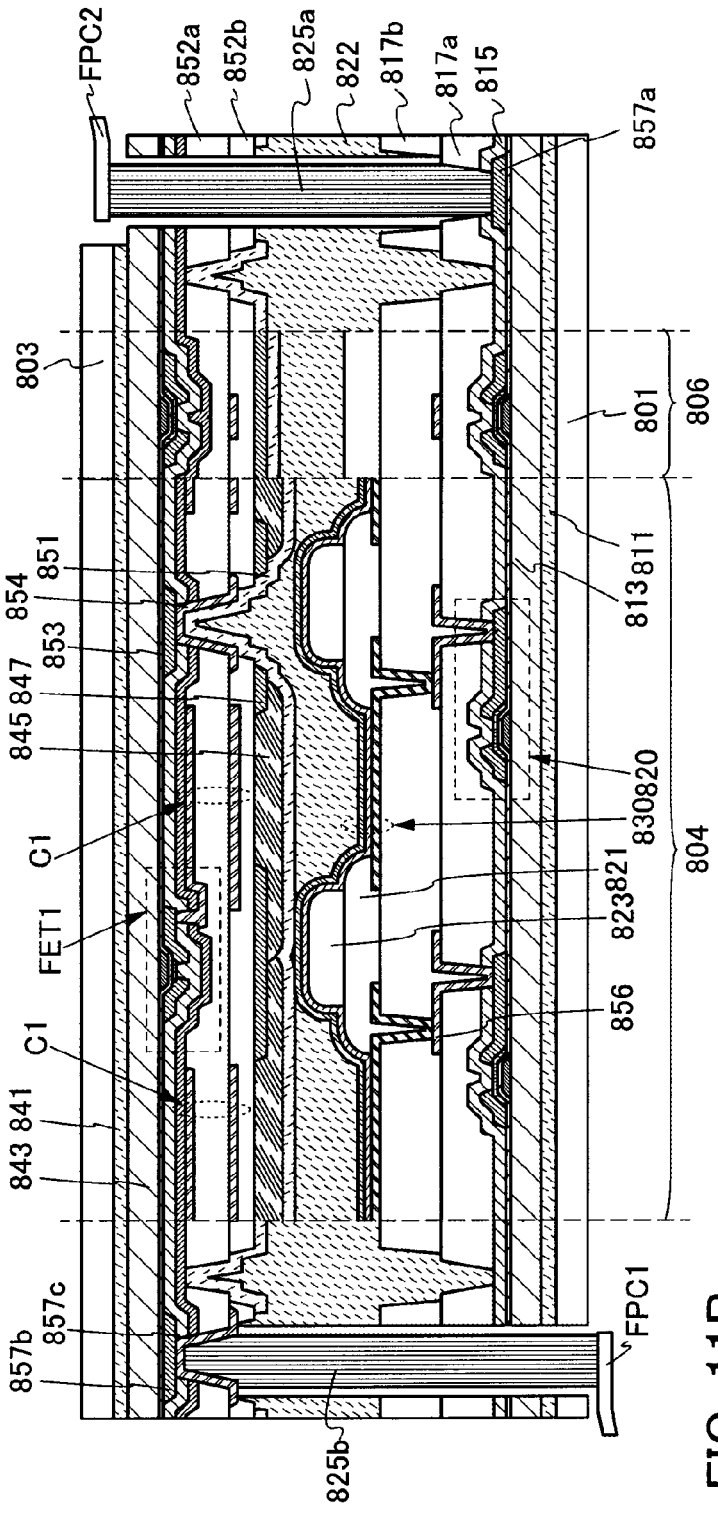
FIGS. 11A and 11B illustrate an example of an input/output device.
Figure 11B:
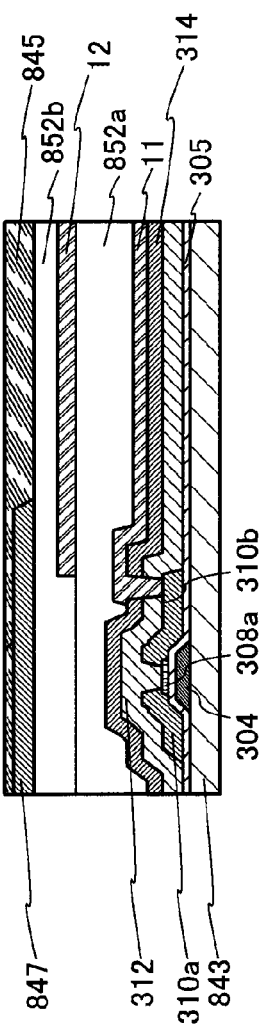

FIG. 11A is an example of a cross-sectional view of the input/output device of one embodiment of the present invention. FIG. 11B is an enlarged view of a transistor FET1 and a sensing element C1.

The input/output device in FIG. 11A includes the substrate 801, the bonding layer 811, the insulating layer 813, a plurality of transistors, a conductive layer 857*a*, the insulating layer 815, the insulating layer 817*a*, the insulating layer 817*b*, the conductive layer 856, a plurality of light-emitting elements, the insulating layer 821, the bonding layer 822, the spacer 823, the conductive layer 851, the insulating layer 852*a*, the insulating layer 852*b*, the conductive layer 853, a conductive layer 854, the coloring layer 845, the light-blocking layer 847, a conductive layer 857*b*, a conductive layer 857*c*, a plurality of sensing elements, the insulating layer 843, the bonding layer 841, and the substrate 803. The bonding layer 822, the conductive layer 851, the insulating layer 852*a*, the insulating layer 852*b*, the insulating layer 843, the bonding layer 841, and the substrate 803 transmit visible light.

In FIG. 11A, the light-emitting element 830, the transistors, and the sensing element C1 included in the light-emitting unit 804 and the driver circuit unit 806 are sealed with the substrate 801, the substrate 803, and the bonding layer 822.

To fabricate the input/output device in FIG. 11A, first, a pair of formation substrates is prepared. The insulating layer 813, the transistor 820, the light-emitting element 830, and the like are formed over one of the formation substrates. The insulating layer 843, the transistor FET1, the sensing element C1, the conductive layer 851, the insulating layer 852*a*, the insulating layer 852*b*, the conductive layer 853, and the like are formed over the other formation substrate. Subsequently, the formation substrates are attached to each other with the bonding layer 822. Then, the formation substrates are peeled, the substrate 801 is attached to the exposed insulating layer 813 with the bonding layer 811, and similarly, the substrate 803 is attached to the exposed insulating layer 843 with the bonding layer 841. Thus, the input/output device is completed.

The input/output device of one embodiment of the present invention can be fabricated by applying a method for manufacturing a light-emitting device of one embodiment of the present invention (specifically, by changing a structure of a layer to be separated); the manufacturing method will be described in detail in Embodiment 5. A transistor and the like are formed over a formation substrate with high heat resistance, so that a highly reliable transistor and an insulating film with sufficiently high moisture resistance can be formed at high temperatures. Then, the transistor and the insulating film are transferred to a substrate with low heat resistance, whereby a highly reliable input/output device can be manufactured. Thus, one embodiment of the present invention can provide a thin or/and lightweight input/output device with high reliability.

The conductive layer 851 is connected to the conductive layer 854 through an opening in the insulating layer 852b. The conductive layer 854 is connected to the conductive layer 853 through an opening in the insulating layer 852a. The conductive layer 851 is also connected to the second electrode 835. That is, the second electrode 835, the conductive layer 851, the conductive layer 854, and the conductive layer 853 are electrically connected to each other, thereby suppressing a voltage drop of the second electrode 835 and thus reducing unevenness in display luminance of the input/output device. Note that the insulating layer 852b is not always necessary. Furthermore, the conductive layer 851 and the conductive layer 853 may be directly connected without providing the conductive layer 854. An overcoat may be provided between the conductive layer 851 and the coloring layer 845 or the light-blocking layer 847.

Since the conductive layer 851 is formed using a material that transmit light from the light-emitting element 830, the conductive layer 851 can be formed extensively on the whole surface of the input/output device. Accordingly, the area where the second electrode 835 and the conductive layer 851 are in contact with each other can be increased, and the contact resistance between the second electrode 835 and the conductive layer 851 can be lowered.

The conductive layer 853 does not necessarily have transmittance because it does not overlap a light-emitting region of the light-emitting element 830 (i.e., it overlaps the insulating layer 821). For this reason, the conductive layer 853 can be formed using a wider range of materials than the conductive layer 851. When the conductive layer 853 is formed using a material with lower resistance than the conductive layer 851, a voltage drop of the second electrode 835 can be further suppressed. Thus, one embodiment of the present invention achieves an input/output device with little unevenness in display luminance.

The substrate 801 and the substrate 803 are attached to each other with the bonding layer 822. The bonding layer 822 is positioned between the light-emitting element 830 and the conductive layer 851. In this case, the wettability of the conductive layer 851 to a material of the bonding layer 822 is preferably high. High wettability to the material of the bonding layer 822 can reduce air bubbles entering when the pair of formation substrates are attached to each other, and the substrates can be attached with a high yield. Moreover, the input/output device can be highly reliable. The conductive layer 851 may be provided only in the light-emitting unit 804, provided in the light-emitting unit 804 and the driver circuit unit 806, or provided on the entire surface over the insulating layer 843.

The conductive layer 857a is electrically connected to an external input terminal through which a signal or a potential from the outside is transmitted to the driver circuit unit 806. Here, an example in which FPC2 is provided as the external input terminal is described. To prevent an increase in the number of fabrication steps, the conductive layer 857a is preferably formed using the same material and the same step as those of the electrode or the wiring in the light-emitting unit or the driver circuit unit. Here, an example is described in which the conductive layer 857a is formed using the same material and the same step as those of the electrodes of the transistor 820. The conductive layer 857a is electrically connected to FPC2 through a connector 825a. Similarly, the conductive layers 857b and 857c are electrically connected to FPC1 through a connector 825b.

As illustrated in FIG. 11B, the transistor FET1 includes a gate electrode 304 over the insulating layer 843, the gate insulating layer 305 covering the gate electrode 304, and a semiconductor layer 308a and a pair of electrodes (an electrode 310a and an electrode 310b) over the gate insulating layer 305. The semiconductor layer 308a is connected to the pair of electrodes. The pair of electrodes functions as a source electrode and a drain electrode. The transistor FET1 is covered with the insulating layer 312 and the insulating layer 314. One of the insulating layers 312 and 314 is not necessarily provided. The sensing element C1 includes the first electrode 11 over the insulating layer 314, the insulating layer 852a over the first electrode 11, and the second electrode 12 over the insulating layer 852a. The insulating layer 852b is provided over the second electrode 12. The light-blocking layer 847 and the coloring layer 845 are provided over insulating layer 852b. Although an example where the transistor FET1 overlaps with the light-blocking layer 847 and the sensing element C1 overlaps with the coloring layer 845 is shown here, one embodiment of the present invention is not limited to this example. For example, both the transistor FET1 and the sensing element C1 may overlap with the light-blocking layer 847. Here, the electrode of the sensing element C1 does not necessarily have transmittance. When the electrode of the sensing element C1 overlaps with the coloring layer 845 or a light-emitting region of the light-emitting element 830, the electrode is preferably formed using a light-transmitting material.

The first electrode 11 or the second electrode 12 may be formed using the same material and the same step as those of a backgate of a transistor. FIG. 11A illustrates an example where a transistor included in the driver circuit unit 806 has a backgate; however, one embodiment of the present invention is not limited to this example.

Note that a user of the input/output device in FIG. 11A may recognize a wiring, the electrode of the transistor FET1, the conductive layer 853, or the like. For this reason, a film with low reflectivity or a light-blocking film may be provided between the substrate 803 and the transistor FET1. Moreover, a conductive film with low reflectivity may be used as the conductive layer 853.

Specific Example 2 of Cross-Sectional Structure of Input/Output Device

FIG. 12A is an example of a cross-sectional view of the input/output device of one embodiment of the present invention. FIG. 12B is an enlarged view of a transistor FET2 and a sensing element C2.

The input/output device in FIG. 12A is different from that in FIG. 11A in including the transistor FET2 and the sensing element C2. The description of features common to the input/output device of FIG. 11A is omitted.

As illustrated in FIG. 12B, the transistor FET2 includes the gate electrode 304 over the insulating layer 843, the gate insulating layer 305 covering the gate electrode 304, and a semiconductor layer 308a and a pair of electrodes 310a and 310b over the gate insulating layer 305. The semiconductor layer 308a is connected to the pair of electrodes 310a and 310b. The pair of electrodes 310a and 310b functions as a source electrode and a drain electrode. The transistor FET2 is covered with the insulating layer 312 and the insulating layer 314. One of the insulating layers 312 and 314 is not necessarily provided. The sensing element C2 includes the first electrode 11 over the gate insulating layer 305, the insulating layer 314 and the insulating layer 852a over the first electrode 11, and the second electrode 12 over the insulating layer 852a. The insulating layer 852b is provided over the second electrode 12. The light-blocking layer 847 and the coloring layer 845 are provided over insulating layer 852b. Although an example where the transistor FET2 overlaps with the light-blocking layer 847 and the sensing element C2 overlaps with the coloring layer 845 is shown here, one embodiment of the present invention is not limited to this example. For example, both the transistor FET2 and the sensing element C2 may overlap with the light-blocking layer 847.

In one embodiment of the present invention, the semiconductor layer of the transistor and the electrode of the sensing element are preferably formed in the same step, in which case the number of steps for fabricating the input/output device can be reduced, and the fabrication cost can be reduced.

For example, an oxide semiconductor can be used for the semiconductor layer of the transistor. An oxide semiconductor layer has a high light-transmitting property. By increasing oxygen vacancies and/or impurities such as hydrogen or water in the oxide semiconductor layer, an oxide semiconductor layer having a high carrier density and a low resistance (also referred to as oxide conductor layer) is obtained. Such an oxide semiconductor layer can be favorably used as the electrode of the capacitor of the touch sensor.

Specifically, plasma treatment is performed on an island-like oxide semiconductor layer that is to be the first electrode 11 to increase oxygen vacancies and/or impurities such as hydrogen or water in the oxide semiconductor layer; thus, the oxide semiconductor layer can have a high carrier density and a low resistance.

A typical example of the plasma treatment performed on the oxide semiconductor layer is plasma treatment using a gas containing one of a rare gas (He, Ne, Ar, Kr, or Xe), phosphorus, boron, hydrogen, and nitrogen. Specific examples include plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, and plasma treatment in a nitrogen atmosphere.

Furthermore, the insulating layer 314 containing hydrogen is formed in contact with the oxide semiconductor layer to diffuse hydrogen from the insulating layer containing hydrogen to the oxide semiconductor layer, so that the oxide semiconductor layer can have a high carrier density and a low resistance. An example of an insulating film containing hydrogen, that is, an insulating film capable of releasing hydrogen is a silicon nitride film.

The insulating layer 312 is provided over the transistor FET2 to prevent the semiconductor layer 308a from being subjected to the plasma treatment. Since the insulating layer 312 is provided, the semiconductor layer 308a is not in contact with the insulating layer 314 containing hydrogen. By using an insulating film capable of releasing oxygen as the insulating layer 312, oxygen can be supplied to the semiconductor layer 308a. The semiconductor layer 308a to which oxygen is supplied is a high-resistance oxide semiconductor in which oxygen vacancies in the film or at the interface are reduced. As the insulating film capable of releasing oxygen, a silicon oxide film or a silicon oxynitride film can be used, for example.

As described above, the input/output device of one embodiment of the present invention achieves both thinness and high detection sensitivity by using an active matrix touch sensor. Furthermore, providing a light-emitting element with an auxiliary electrode suppresses a voltage drop of the electrode of the light-emitting element and reduces unevenness in display luminance.

The auxiliary electrode is formed in the same step as another conductive film, whereby the auxiliary electrode can be formed without an increase in the number of steps.

In the input/output device of one embodiment of the present invention, a conductive film having high wettability to the material of a bonding layer is provided in contact with the bonding layer. Therefore, entry of air bubbles can be prevented when the bonding layer attaches a pair of substrates to each other, so that the substrates can be attached with a high yield.

This embodiment can be combined with any other embodiment as appropriate.

Embodiment 4

In this embodiment, an input/output device of one embodiment of the present invention will be described with reference to a drawing.

As has been described in Embodiment 1 and the like, the first conductive layer that is in contact with a bonding layer when the bonding layer fills a space between the first substrate and the second substrate preferably has high wettability to the material of the bonding layer. High wettability to the material of the bonding layer can reduce air bubbles that enter when the first substrate and the second substrate are attached to each other, and the substrates can be attached with a high yield. In addition, a light-emitting device or an input/output device can have high reliability regardless of whether an auxiliary electrode is electrically connected to the electrode of the light-emitting element.

Figure 13:
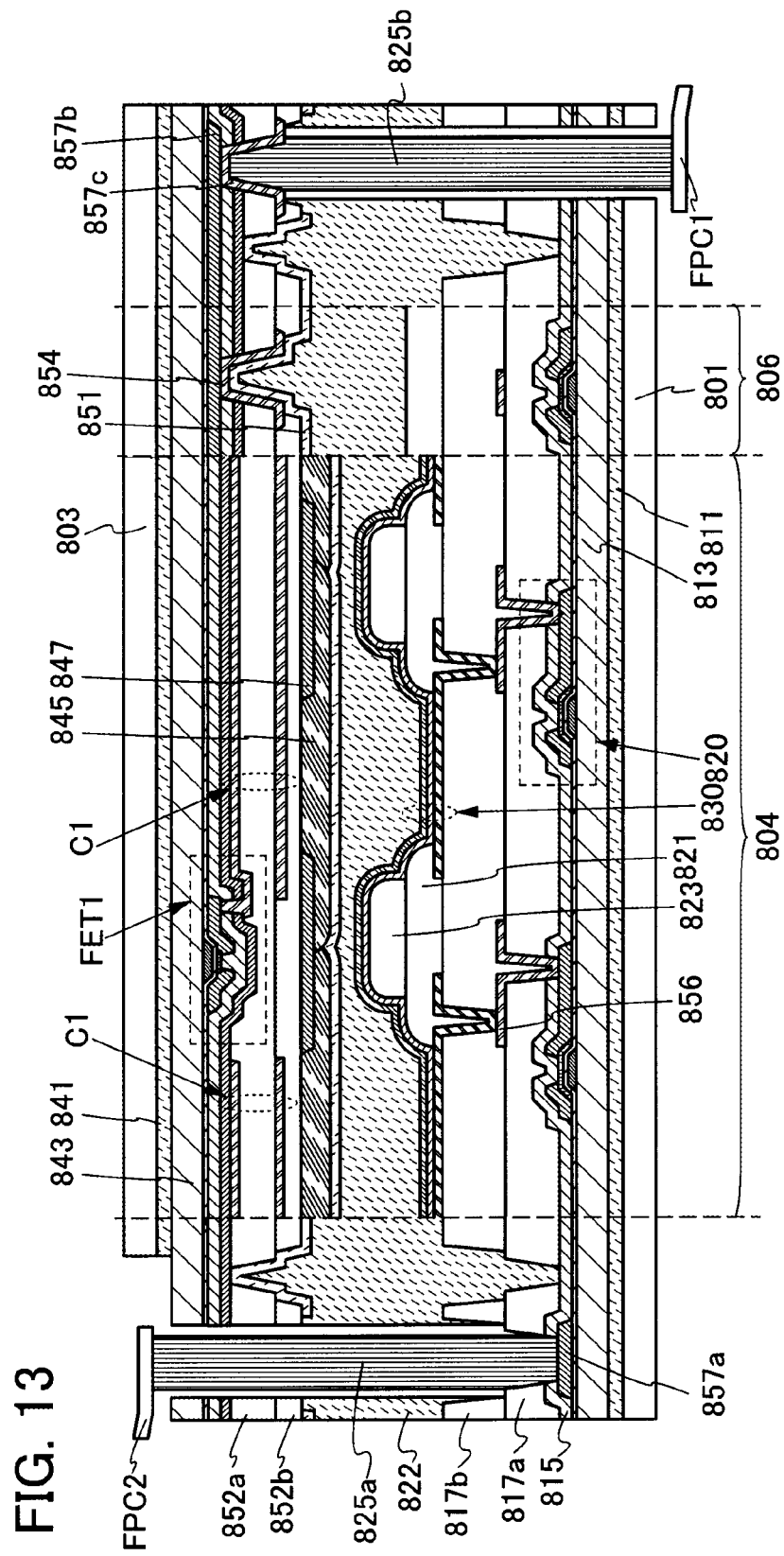
FIG. 13 illustrates an example of an input/output device.

For example, in one embodiment of the present invention, it is possible that the second conductive layer (conductive layer 853) is not provided as illustrated in FIG. 13. Moreover, in one embodiment of the present invention, it is possible that the first conductive layer (conductive layer 851) is not electrically connected to the electrode of the light-emitting element.

In the input/output device, parasitic capacitance is sometimes generated between a wiring or an electrode included in the capacitive touch sensor and a wiring or an electrode included in the pixel. The detection sensitivity of the touch sensor might be decreased when noise generated while the display element such as the light-emitting element operates travels to the touch sensor through the parasitic capacitance.

In view of the above, the potential of the conductive layer 851 is set at a constant potential in the input/output device of one embodiment of the present invention. Thus, noise is blocked, and a decrease in the detection sensitivity of the touch sensor can be suppressed.

The potential of the conductive layer 851 can be any potential except a floating potential and may be a ground potential, for example.

In light of the above, one embodiment of the present invention is an input/output device including a first substrate, a first transistor over the first substrate, a light-emitting element over the first transistor, a bonding layer over the light-emitting element, a first conductive layer over the bonding layer, a first insulating layer over the first conductive layer, a second conductive layer over the first insulating layer, a second substrate over the second conductive layer, and a second transistor and a capacitor between the first conductive layer and the second substrate. The light-emitting element emits light toward the second substrate. The first transistor and the light-emitting element are electrically connected to each other. The second transistor and the capacitor are electrically connected to each other. The first conductive layer overlaps with the light-emitting element and transmits light emitted from the light-emitting element. The first conductive layer is electrically connected to the second conductive layer. The first conductive layer can be supplied with a predetermined potential. It is preferred that the second conductive layer be formed on the same plane as and contain the same material as a gate electrode or source and drain electrodes of the second transistor.

Note that in the input/output device shown in Embodiment 3, the second electrode, the first conductive layer, and the second conductive layer are electrically connected to each other; thus, a predetermined potential is supplied to the first conductive layer (i.e., the potential of the first conductive layer is not floating). Consequently, a decrease in the detection sensitivity of the touch sensor can be suppressed.

FIG. 13 is an example of a cross-sectional view of an input/output device in one embodiment of the present invention.

The input/output device in FIG. 13 includes the substrate 801, the bonding layer 811, the insulating layer 813, a plurality of transistors, the conductive layer 857a, the insulating layer 815, the insulating layer 817a, the insulating layer 817b, the conductive layer 856, a plurality of light-emitting elements, the insulating layer 821, the bonding layer 822, the spacer 823, the conductive layer 851, the insulating layer 852a, the insulating layer 852b, the conductive layer 854, the coloring layer 845, the light-blocking layer 847, the conductive layer 857b, the conductive layer 857c, a plurality of sensing elements, the insulating layer 843, the bonding layer 841, and the substrate 803. The bonding layer 822, the conductive layer 851, the insulating layer 852a, the insulating layer 852b, the insulating layer 843, the bonding layer 841, and the substrate 803 transmit visible light.

FIG. 13 shows an example where the conductive layer 851, the conductive layer 854, the conductive layer 857b, FPC1, and the connector 825b are electrically connected to each other. This structure enables a predetermined potential to be supplied to the conductive layer 851.

As described above, in the input/output device of one embodiment of the present invention, a conductive film having high wettability to the material of a bonding layer is provided in contact with the bonding layer. Therefore, entry of air bubbles can be prevented when the bonding layer attaches a pair of substrates to each other, so that the substrates can be attached with a high yield. Furthermore, in the input/output device of one embodiment of the present invention, a constant potential can be supplied to the conductive film, thereby suppressing transmission of noise to the touch sensor through parasitic capacitance and suppressing a decrease in the detection sensitivity of the touch sensor.

This embodiment can be combined with any other embodiment as appropriate.

Embodiment 5

In this embodiment, a method for manufacturing a flexible light-emitting device of one embodiment of the present invention will be described. Note that the manufacturing method described in this embodiment enables fabrication of a flexible input/output device of one embodiment of the present invention by changing a layer formed as a layer to be separated (also referred to as peeled layer).

Figure 14A:
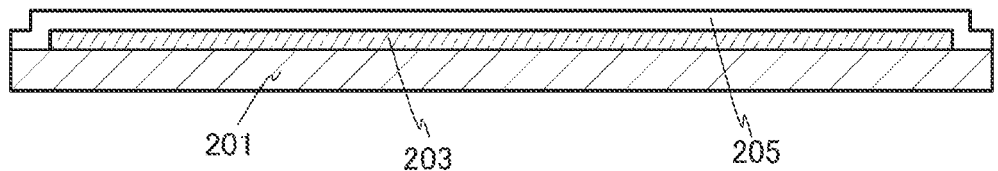
FIGS. 14A to 14D illustrate an example of a method for manufacturing a light-emitting device.
Figure 14B:
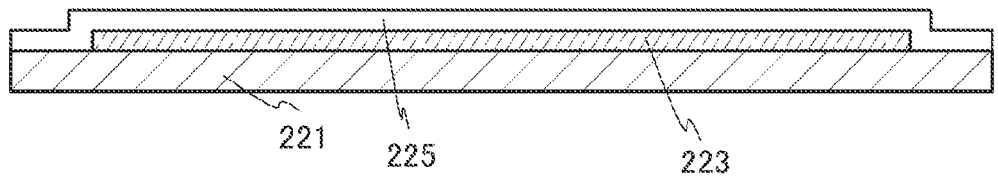

First, a separation layer 203 is formed over a formation substrate 201, and a layer 205 to be separated (hereinafter referred to simply as a layer 205) is formed over the separation layer 203 (FIG. 14A). Moreover, a separation layer 223 is formed over a formation substrate 221, and a layer 225 to be separated (hereinafter referred to simply as a layer 225) is formed over the separation layer 223 (FIG. 14B).

Although an example in which the separation layer is formed to have an island shape is described here, one embodiment of the present invention is not limited to this example. In this step, the material of the separation layer is selected such that peeling occurs at the interface between the formation substrate and the separation layer, the interface between the separation layer and the peeled layer, or in the separation layer when the peeled layer is peeled from the formation substrate. In this embodiment, an example in which peeling occurs at the interface between the separation layer and the peeled layer is described; however, one embodiment of the present invention is not limited to such an example and depends on materials used for the separation layer and the peeled layer. Note that in the case where the peeled layer has a stacked-layer structure, a layer in contact with the separation layer is particularly referred to as a first layer.

For example, when the separation layer has a stacked-layer structure of a tungsten film and a tungsten oxide film and peeling occurs at the interface between the tungsten film and the tungsten oxide film (or the vicinity of the interface), part of the separation layer (here, part of the tungsten oxide film) may remain on the peeled layer. Moreover, the separation layer remaining on the peeled layer may be removed after peeling.

As the formation substrate, a substrate having heat resistance high enough to withstand at least the process temperature in a manufacturing process is used. As the formation substrate, for example, a glass substrate, a quartz substrate, a sapphire substrate, a semiconductor substrate, a ceramic substrate, a metal substrate, a resin substrate, or a plastic substrate can be used.

When a glass substrate is used as the formation substrate, an insulating film such as a silicon oxide film, a silicon oxynitride film, a silicon nitride film, or a silicon nitride oxide film is preferably formed as a base film between the formation substrate and the separation layer, in which case contamination from the glass substrate can be prevented.

The separation layer can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or In—Ga—Zn oxide may be used. The separation layer is preferably formed using a high-melting point metal material such as tungsten, titanium, or molybdenum, in which case the degree of freedom of the process for forming the peeled layer can be increased.

The separation layer can be formed by, for example, a sputtering method, a plasma-enhanced CVD method, a coating method (including a spin coating method, a droplet discharging method, and a dispensing method), or a printing method. The thickness of the separation layer ranges from 10 nm to 200 nm, for example, and preferably from 20 nm to 100 nm.

When the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

When the separation layer has a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Note that the separation layer is not necessarily provided in the case where peeling at an interface between the formation substrate and the peeled layer is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is increased by laser light irradiation or heat treatment. Then, an insulating film, a transistor, and the like are formed over the organic resin. After that, peeling at the interface between the formation substrate and the organic resin can be performed by performing laser light irradiation with higher energy density than the above laser light irradiation or performing heat treatment at a higher temperature than the above heat treatment. Moreover, the interface between the formation substrate and the organic resin may be soaked in a liquid to perform peeling.

Since the insulating film, the transistor, and the like are formed over the organic resin having low heat resistance in the above method, it is impossible to expose the substrate to high temperatures in the manufacturing process. Note that a transistor using an oxide semiconductor is not necessarily processed at high temperatures and thus can be favorably formed over the organic resin.

The organic resin may be used for a substrate of the device. Alternatively, the organic resin may be removed and another substrate may be bonded to an exposed surface of the peeled layer with the use of an adhesive.

Alternatively, peeling at the interface between a metal layer and the organic resin may be performed in the following manner: the metal layer is provided between the formation substrate and the organic resin and current is made to flow in the metal layer so that the metal layer is heated.

There is no particular limitation on a layer formed as the peeled layer. For example, to manufacture the light-emitting device illustrated in FIG. 2A, the insulating layer 813, the transistor 820, the light-emitting element 830, and the like are formed as one of the peeled layers, whereas the insulating layer 843, the conductive layer 851, the conductive layer 853, the coloring layer 845, the light-blocking layer 847, and the like are formed as the other peeled layer.

The insulating layers 813 and 843 formed in contact with the separation layer preferably have a single-layer structure or a stacked-layer structure including any of a silicon nitride film, a silicon oxynitride film, a silicon oxide film, a silicon nitride oxide film, and the like.

The insulating layers 813 and 843 can be formed by a sputtering method, a plasma-enhanced CVD method, a coating method, a printing method, or the like. For example, the insulating layer is formed at temperatures ranging from 250° C. to 400° C. by a plasma-enhanced CVD method, whereby the insulating layer can be a dense film with very high resistance to moisture. The thickness of the insulating layer ranges preferably from 10 nm to 3000 nm, more preferably from 200 nm to 1500 nm.

Figure 14C:
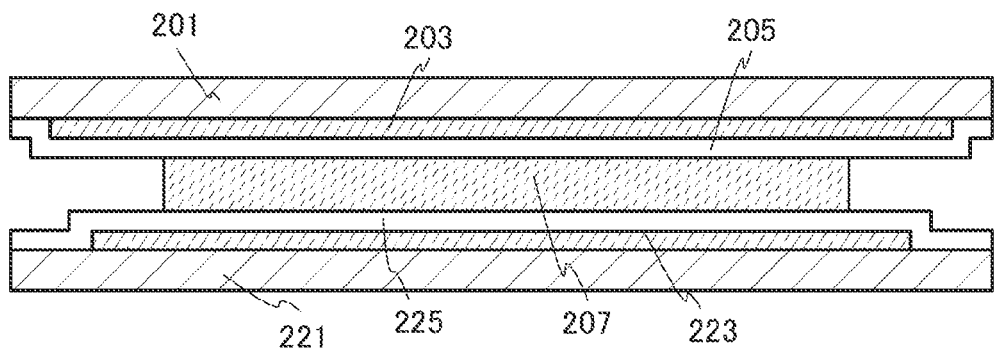

Next, the formation substrate 201 and the formation substrate 221 are attached to each other with a bonding layer 207 so that surfaces on which the peeled layers are formed face each other, and the bonding layer 207 is cured (FIG. 14C).

Note that the formation substrate 201 and the formation substrate 221 are preferably attached to each other in a reduced-pressure atmosphere.

Figure 14D:
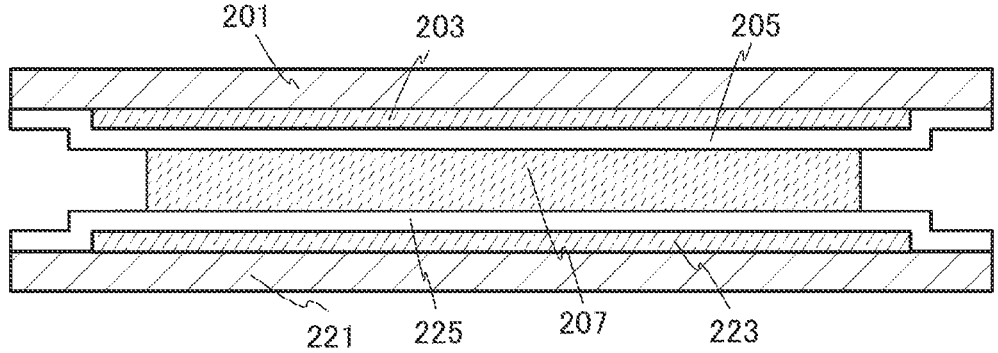

Although FIG. 14C illustrates the case where the separation layer 203 and the separation layer 223 have different sizes, the separation layers may have the same size as illustrated in FIG. 14D.

The bonding layer 207 is provided to overlap with the separation layer 203, the layer 205, the layer 225, and the separation layer 223. The edges of the bonding layer 207 preferably overlap at least one of the separation layer 203 and the separation layer 223 (the one intended to be separated first). Accordingly, strong adhesion between the formation substrate 201 and the formation substrate 221 can be suppressed; thus, a decrease in yield of a subsequent separation process can be suppressed.

As the bonding layer 207, various curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC resin, a PVB resin, and an EVA resin. A material with low moisture permeability, such as an epoxy resin, is particularly preferred. For the adhesive, a material having fluidity low enough to dispose the material only in a desired region is preferably used. For example, an adhesive sheet, a bonding sheet, or a sheet-like or film-like adhesive can be used, and an optical clear adhesive (OCA) film can be preferably used.

The adhesive may have adhesion before attachment or exhibit adhesion after attachment by heating or light irradiation.

Furthermore, the resin may include a drying agent. For example, it is possible to use a substance that adsorbs moisture by chemical adsorption, such as oxide of an alkaline earth metal (e.g., calcium oxide or barium oxide), or a substance that adsorbs moisture by physical adsorption, such as zeolite or silica gel. The drying agent is preferably included, in which case it can suppress deterioration of the functional element due to entry of moisture in the air and can improve the reliability of the device.

Figure 15A:
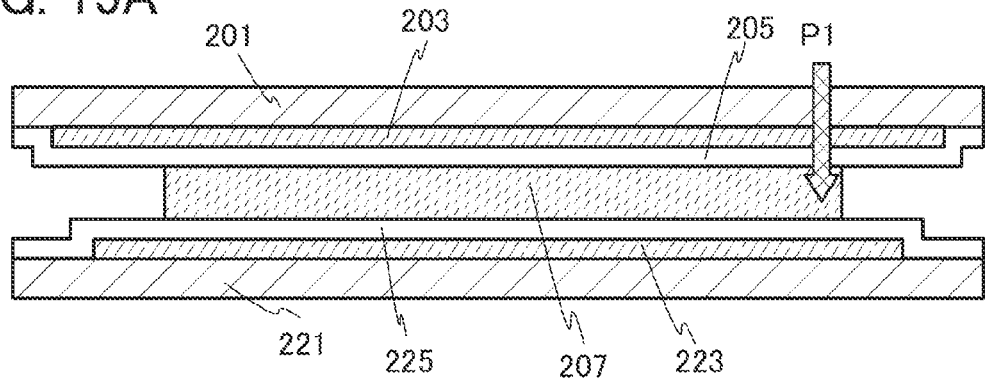
FIGS. 15A to 15D illustrate an example of a method for manufacturing a light-emitting device.
Figure 15B:
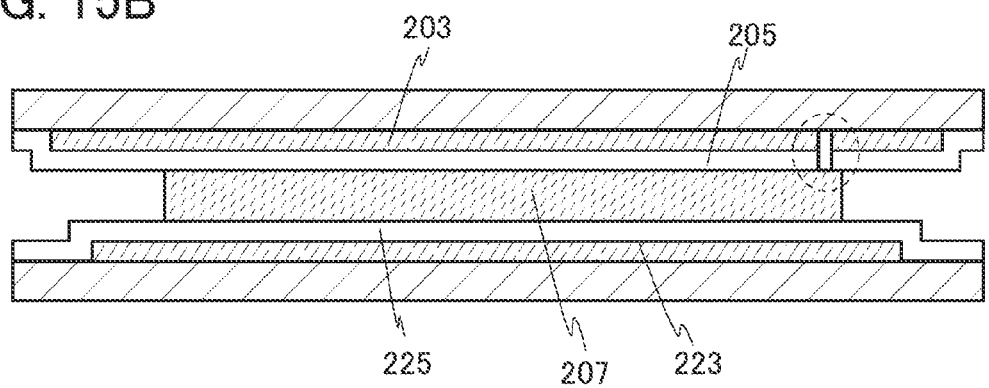

Next, a separation trigger is formed by laser light irradiation (FIGS. 15A and 15B).

Either the formation substrate 201 or the formation substrate 221 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed only over one of the substrates, the substrate where the element is formed may be separated first or the other substrate may be separated first. Here, an example in which the formation substrate 201 is separated first is described.

A region where the cured bonding layer 207, the layer 205, and the separation layer 203 overlap with each other is irradiated with laser light (see an arrow P1 in FIG. 15A).

Part of the first layer is removed; thus, the separation trigger can be formed (see a region surrounded by a dashed line in FIG. 15B). At this time, not only the first layer but also the separation layer 203, the bonding layer 207, or another layer included in the layer 205 may be partly removed.

Laser light is preferably applied toward the substrate provided with the separation layer that is desirably peeled. When a region where the separation layer 203 and the separation layer 223 overlap with each other is irradiated with laser light, the formation substrate 201 and the separation layer 203 can be selectively separated by cracking only the layer 205 between the layer 205 and the layer 225 (see the region surrounded by the dashed line in FIG. 15B. Here, an example in which films of the layer 205 are partly removed is shown).

Figure 15C:
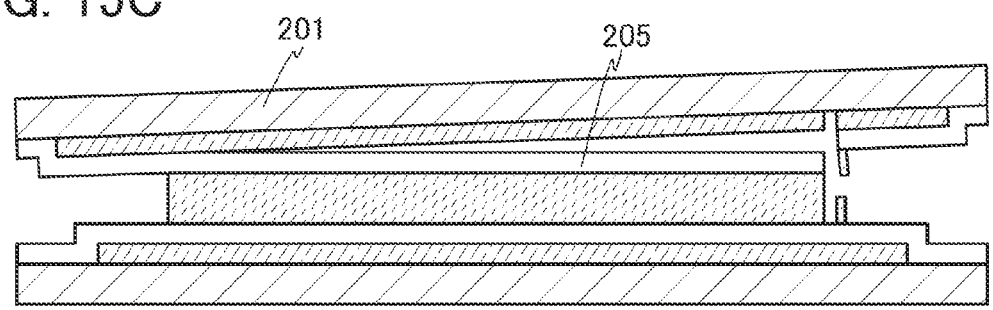
Figure 15D:
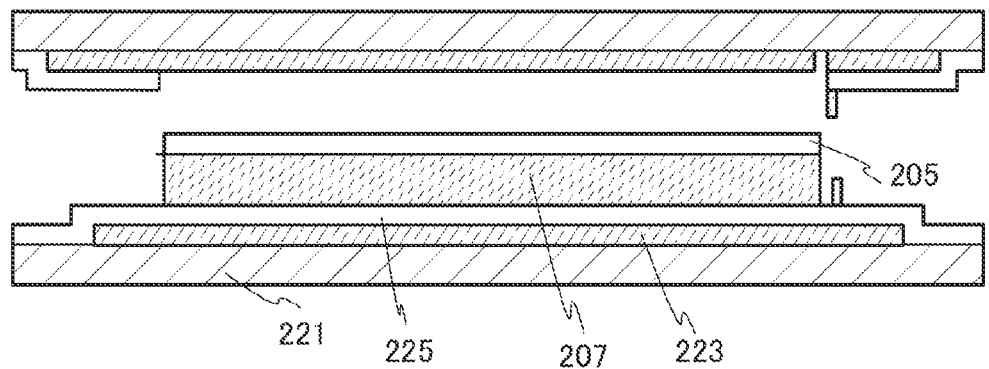

Then, the layer 205 and the formation substrate 201 are separated from each other from the separation trigger (FIGS. 15C and 15D). Thus, the layer 205 can be transferred from the formation substrate 201 to the formation substrate 221.

For example, the layer 205 and the formation substrate 201 may be separated from the separation trigger by mechanical force (e.g., a peeling process with a human hand or a gripper, or a peeling process by rotation of a roller).

Alternatively, the formation substrate 201 and the layer 205 may be separated by filling the interface between the separation layer 203 and the layer 205 with a liquid such as water. A portion between the separation layer 203 and the layer 205 absorbs a liquid through capillarity action, so that the separation layer 203 can be separated easily. Furthermore, an adverse effect of static electricity caused at separation on the functional element included in the layer 205 (e.g., damage to a semiconductor element from static electricity) can be suppressed.

Figure 16A:
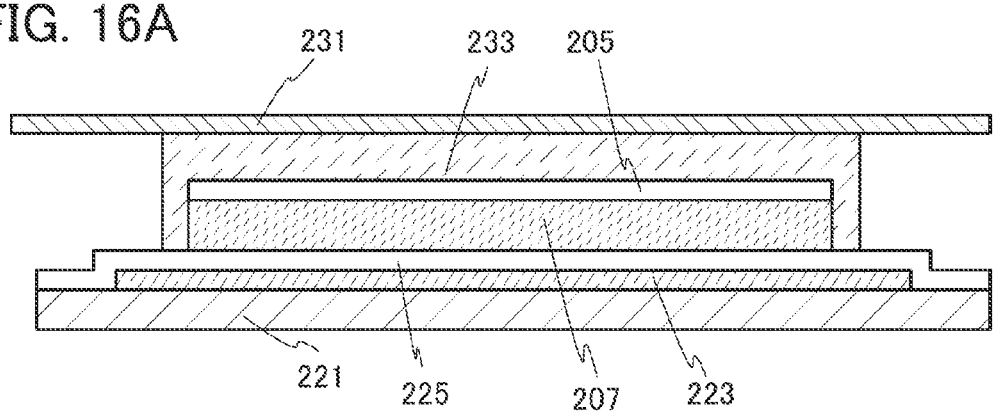
FIGS. 16A to 16D illustrate an example of a method for manufacturing a light-emitting device.

Next, the exposed layer 205 is attached to a substrate 231 with a bonding layer 233, and the bonding layer 233 is cured (FIG. 16A).

Note that the layer 205 and the substrate 231 are preferably attached to each other in a reduced-pressure atmosphere.

Figure 16B:
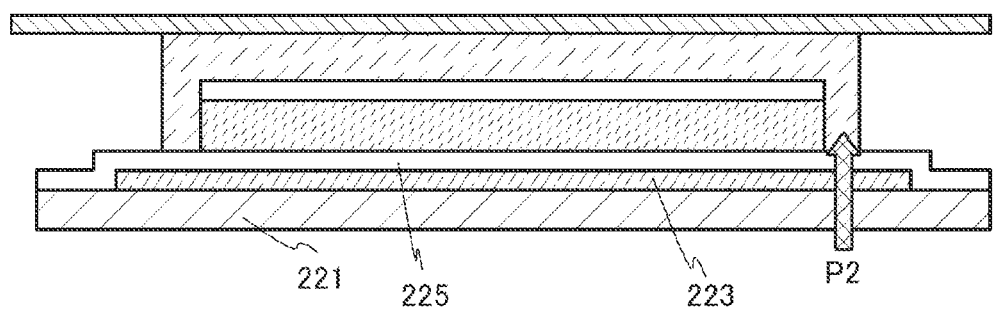
Figure 16C:
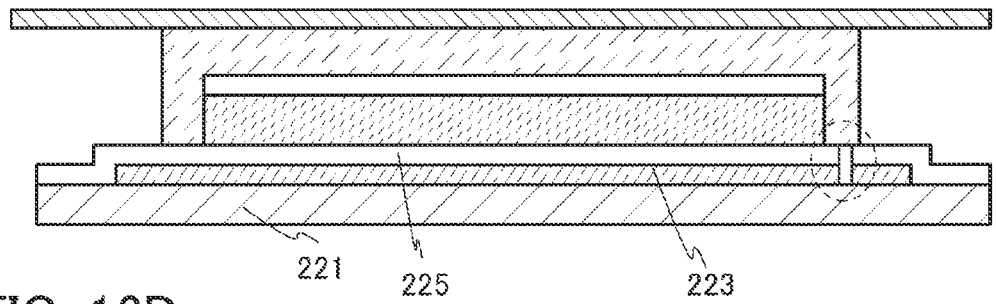

Subsequently, a separation trigger is formed by laser light irradiation (FIGS. 16B and 16C).

A region where the cured bonding layer 233, the layer 225, and the separation layer 223 overlap with each other is irradiated with laser light (see an arrow P2 in FIG. 16B). Part of the first layer is removed; thus, the separation trigger can be formed (see a region surrounded by a dashed line in FIG. 16C. Here, an example in which films of the layer 225 are partly removed is shown). At this time, not only the first layer but also the separation layer 223, the bonding layer 233, or another layer included in the layer 225 may be partly removed.

Laser light is preferably applied toward the formation substrate 221 provided with the separation layer 223.

Figure 16D:
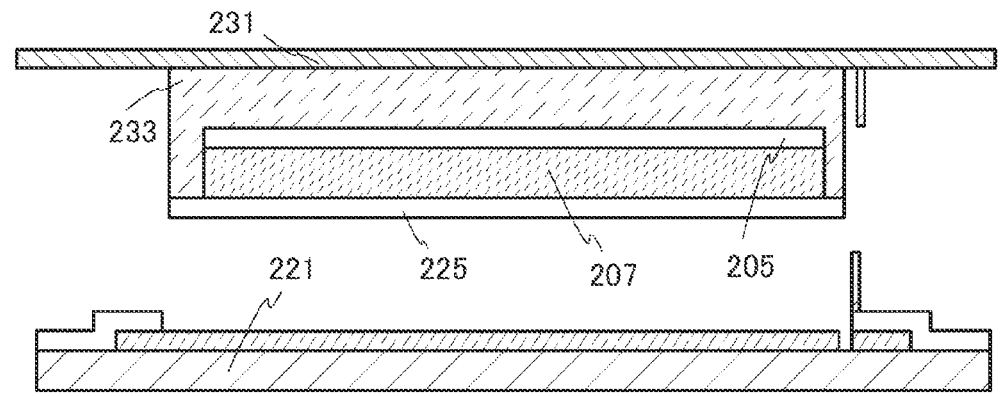

Then, the layer 225 and the formation substrate 221 are separated from each other from the separation trigger (FIG. 16D). Accordingly, the layer 205 and the layer 225 can be transferred to the substrate 231.

In the above method for manufacturing the light-emitting device of one embodiment of the present invention, separation is performed in such a manner that a separation trigger is formed by laser light irradiation after a pair of formation substrates each provided with a separation layer and a peeled layer are attached to each other and then the separation layers and the peeled layers are made in a state where separation is easily performed. Thus, the yield of the separation process can be improved.

In addition, peeling is performed after the formation substrates each provided with the peeled layer are attached to each other in advance, and then, a substrate where a device is intended to be formed can be attached to the peeled layers. Thus, to attach the peeled layers to each other, formation substrates having low flexibility can be attached to each other; thus, alignment accuracy at the time of attachment can be improved as compared to the case where flexible substrates are attached to each other.

Figure 17A:
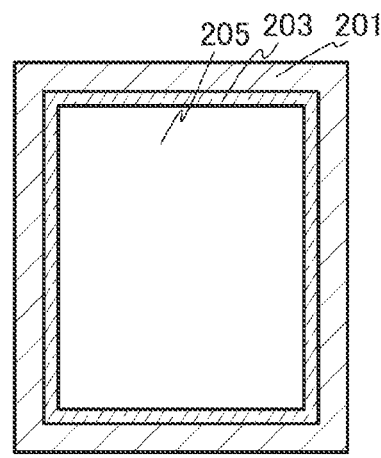
FIGS. 17A to 17C each illustrate an example of a method for manufacturing a light-emitting device.
Figure 17B:
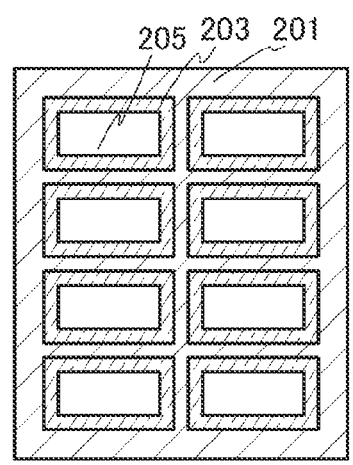
Figure 17C:
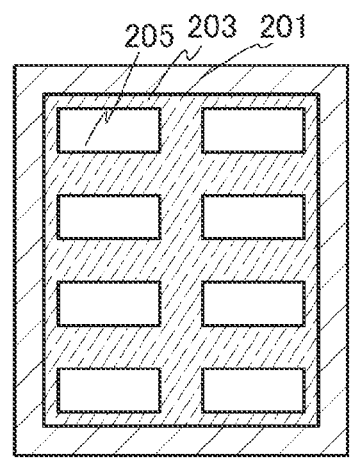

As illustrated in FIG. 17A, the edge of the layer 205 to be separated is preferably positioned on the inner side of the edge of the separation layer 203, in which case the yield of the separation process can be improved. When there are a plurality of layers 205 to be separated, the separation layer 203 may be provided for each layer 205 as illustrated in FIG. 17B or a plurality of layers 205 may be provided over one separation layer 203 as illustrated in FIG. 17C.

This embodiment can be combined with any other embodiment as appropriate.

Embodiment 6

In this embodiment, electronic devices and lighting devices that can be fabricated according to one embodiment of the present invention will be described with reference to FIGS. 18A to 18G and FIGS. 19A to 19I.

The light-emitting device and the input/output device of one embodiment of the present invention are flexible and thus are preferably used in a flexible electronic device and a flexible lighting device. According to one embodiment of the present invention, an electronic device and a lighting device that have high reliability and high resistance to repeated bending can be achieved.

Examples of electronic devices include a television set (also referred to as television or television receiver), a monitor of a computer or the like, a camera such as a digital camera and a digital video camera, a digital photo frame, a mobile phone (also referred to as a cellular phone or mobile phone device), a portable game machine, a portable information appliance, an audio reproducing device, and a large game machine such as a pachinko machine.

The light-emitting device and the input/output device of one embodiment of the present invention have flexibility and therefore can be incorporated along a curved inside/outside wall surface of a house or a building or a curved interior/exterior surface of a car.

An electronic device of one embodiment of the present invention may include an input/output device and a secondary battery. In that case, it is preferred that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

An electronic device of one embodiment of the present invention may include an input/output device and an antenna. Receiving a signal with the antenna enables a display portion to display video, information, and the like. When the electronic device includes a secondary battery, the antenna may be used for non-contact power transmission.

Figure 18A:
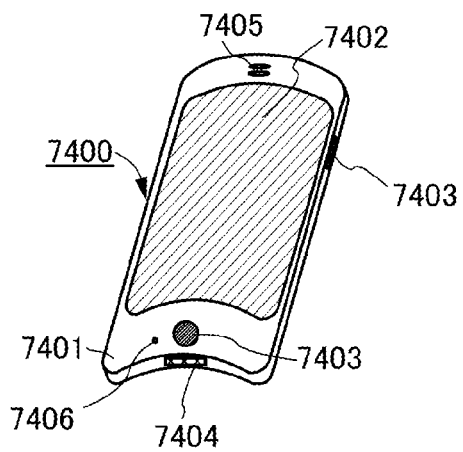
FIGS. 18A to 18G each illustrate an example of an electronic device or a lighting device.

FIG. 18A illustrates an example of a mobile phone. A mobile phone 7400 is provided with a display portion 7402 incorporated in a housing 7401, an operation button 7403, an external connection port 7404, a speaker 7405, a microphone 7406, and the like. The mobile phone 7400 is manufactured using the light-emitting device or the input/output device of one embodiment of the present invention for the display portion 7402. According to one embodiment of the present invention, a highly reliable mobile phone having a curved display portion can be provided with a high yield.

When the display portion 7402 of the mobile phone 7400 in FIG. 18A is touched with a finger or the like, data can be input to the mobile phone 7400. Operations such as making a call and inputting letters can be performed by touch on the display portion 7402 with a finger or the like.

With the operation button 7403, the power can be turned on and off. Furthermore, types of images displayed on the display portion 7402 can be switched; for example, the image can be switched from a mail creation screen to a main menu.

Figure 18B:
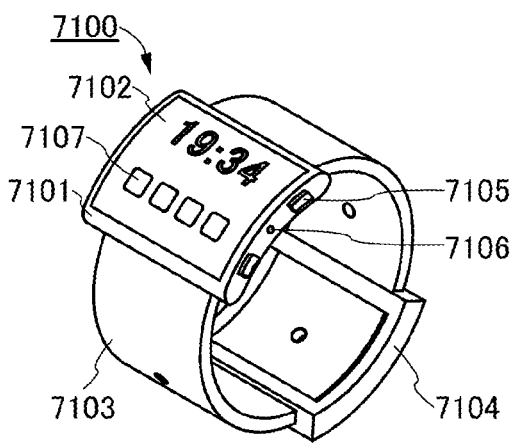

FIG. 18B illustrates an example of a wrist-watch-type portable information appliance. A portable information appliance 7100 includes a housing 7101, a display portion 7102, a band 7103, a buckle 7104, an operation button 7105, an input/output terminal 7106, and the like.

The portable information appliance 7100 is capable of executing a variety of applications such as mobile phone calls, e-mailing, reading and editing texts, music reproduction, Internet communication, and a computer game.

The display surface of the display portion 7102 is curved, and images can be displayed on the curved display surface. The display portion 7102 includes a touch sensor, and operation can be performed by touching the screen with a finger, a stylus, or the like. For example, an application can be started by touching an icon 7107 displayed on the display portion 7102.

With the operation button 7105, a variety of functions such as time setting, power on/off, on/off control of wireless communication, setting and cancellation of manner mode, and setting and cancellation of power saving mode can be performed. For example, the functions of the operation button 7105 can be set freely by the operating system incorporated in the portable information appliance 7100.

The portable information appliance 7100 can employ near field communication, which is a communication method based on an existing communication standard. In that case, for example, hands-free calling is achieved with mutual communication between the portable information appliance 7100 and a headset capable of wireless communication.

Since the portable information appliance 7100 includes the input/output terminal 7106, data can be directly transmitted to and received from another information appliance via a connector. Charging through the input/output terminal 7106 is possible. Note that the charging operation may be performed by wireless power feeding without using the input/output terminal 7106.

The display portion 7102 of the portable information appliance 7100 includes the light-emitting device or the input/output device of one embodiment of the present invention. According to one embodiment of the present invention, a highly reliable portable information appliance having a curved display portion can be provided with a high yield.

Figure 18C:
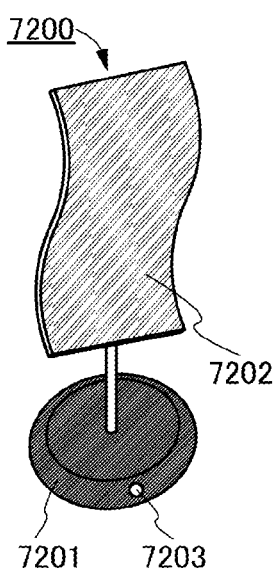
Figure 18D:
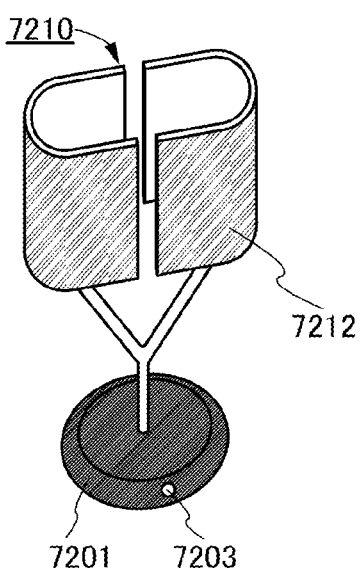
Figure 18E:
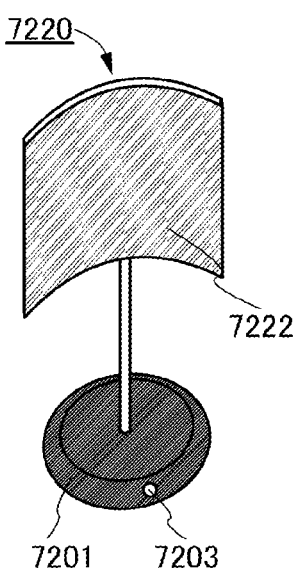

FIGS. 18C to 18E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 18C includes a light-emitting portion 7202 with a wave-shaped light-emitting surface and thus has a sophisticated design.

A light-emitting portion 7212 included in the lighting device 7210 in FIG. 18D has two convex-curved light-emitting portions symmetrically placed. Thus, all directions can be illuminated with the lighting device 7210 as a center.

The lighting device 7220 illustrated in FIG. 18E includes a concave-curved light-emitting portion 7222. This is suitable for illuminating a specific range because light emitted from the light-emitting portion 7222 is collected at the front of the lighting device 7220.

The light-emitting portion included in each of the lighting devices 7200, 7210, and 7220 is flexible; accordingly, the light-emitting portion may be fixed on a plastic member, a movable frame, or the like so that a light-emitting surface of the light-emitting portion can be bent freely depending on the intended use.

Although the lighting devices in which the light-emitting portion is supported by the stage are described as examples, a housing provided with a light-emitting portion can be fixed on a ceiling or suspended from a ceiling. Since the light-emitting surface can be curved, the light-emitting surface can be bent concavely so that a particular region is brightly illuminated, or bent convexly so that the whole room is brightly illuminated.

Here, each of the light-emitting portions includes the light-emitting device or the input/output device of one embodiment of the present invention. According to one embodiment of the present invention, a highly reliable lighting device having a curved light-emitting portion can be provided with a high yield.

Figure 18F:
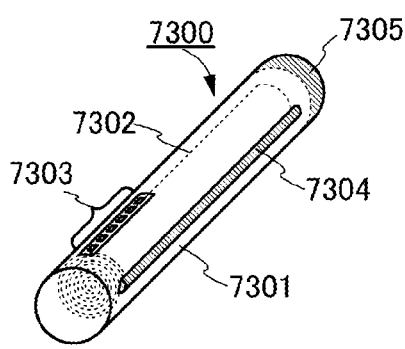

FIG. 18F illustrates an example of a portable input/output device. An input/output device 7300 includes a housing 7301, a display portion 7302, operation buttons 7303, a display portion pull 7304, and a control portion 7305.

The input/output device 7300 includes a rolled flexible display portion 7302 in the cylindrical housing 7301.

The input/output device 7300 can receive a video signal with the control portion 7305 and display the received video on the display portion 7302. The control portion 7305 includes a battery. Moreover, the control portion 7305 may include a terminal portion for connecting a connector so that a video signal or power can be directly supplied from the outside through a wire.

By pressing the operation buttons 7303, power on/off, switching of displayed video, and the like can be performed.

Figure 18G:
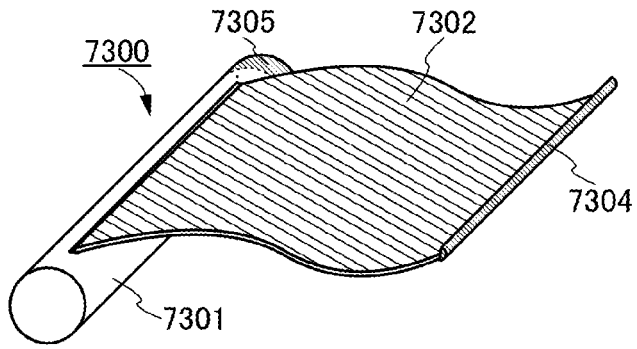

FIG. 18G illustrates the input/output device 7300 in a state where the display portion 7302 is pulled out with the display portion pull 7304. Video can be displayed on the display portion 7302 in this state. The operation buttons 7303 on the surface of the housing 7301 allow one-handed operation. The operation buttons 7303 are provided not in the center of the housing 7301 but on one side of the housing 7301 as illustrated in FIG. 18F, which makes one-handed operation easy.

A reinforcement frame may be provided for a side portion of the display portion 7302 so that the display portion 7302 has a flat display surface when pulled out.

Note that in addition to this structure, the housing may be provided with a speaker so that sound is output with an audio signal received together with a video signal.

The display portion 7302 includes the light-emitting device or the input/output device of one embodiment of the present invention. According to one embodiment of the present invention, a lightweight and highly reliable input/output device can be provided with a high yield.

Figure 19A:
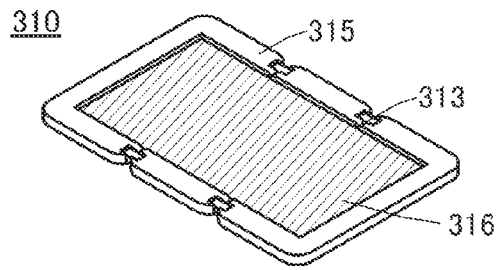
FIGS. 19A to 19I each illustrate an example of an electronic device.
Figure 19B:
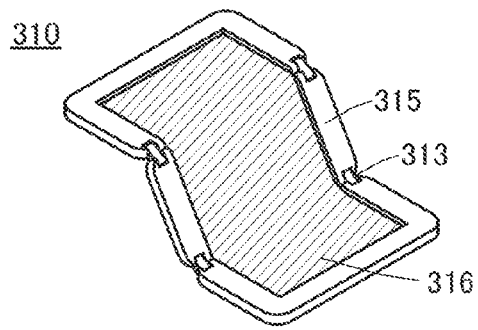
Figure 19C:
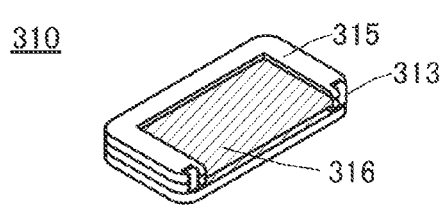

FIGS. 19A to 19C illustrate a foldable portable information appliance 310. FIG. 19A illustrates the portable information appliance 310 that is opened. FIG. 19B illustrates the portable information appliance 310 that is being opened or being folded. FIG. 19C illustrates the portable information appliance 310 that is folded. The portable information appliance 310 is highly portable when folded, and is highly browsable when opened because of a seamless large display area.

A display panel 316 is supported by three housings 315 joined together by hinges 313. By folding the portable information appliance 310 at a connection portion between two housings 315 with the hinges 313, the portable information appliance 310 can be reversibly changed in shape from an opened state to a folded state. The light-emitting device or the input/output device of one embodiment of the present invention can be used for the display panel 316. For example, it is possible to use a light-emitting device or an input/output device that can be bent with a radius of curvature of 1 mm or more and 150 mm or less.

In one embodiment of the present invention, a sensor that senses whether the light-emitting device or the input/output device is folded or opened and supplies sensing information may be provided. When obtaining information indicating that the light-emitting device or the input/output device is folded, a control portion of the light-emitting device or the input/output device may stop a folded portion (or a portion that is folded and cannot be seen by a user) from operating, specifically performing display or sensing by a touch sensor.

Similarly, the control portion of the light-emitting device or the input/output device may make display and sensing by a touch sensor restart when obtaining information indicating that the light-emitting device or the input/output device is opened.

Figure 19D:
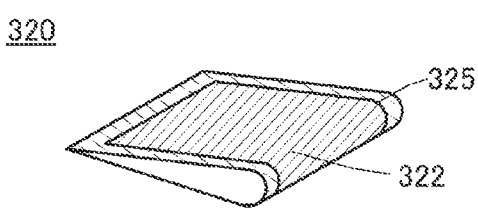
Figure 19E:
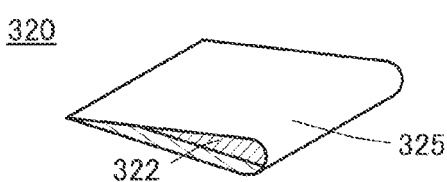

FIGS. 19D and 19E illustrate a foldable portable information appliance 320. FIG. 19D illustrates the portable information appliance 320 that is folded so that a display portion 322 is on the outside. FIG. 19E illustrates the portable information appliance 320 that is folded so that the display portion 322 is on the inside. When the portable information appliance 320 is not used, the portable information appliance 320 is folded so that a non-display portion 325 faces the outside, whereby the display portion 322 can be prevented from being contaminated or damaged. The light-emitting device or the input/output device of one embodiment of the present invention can be used for the display portion 322.

Figure 19F:
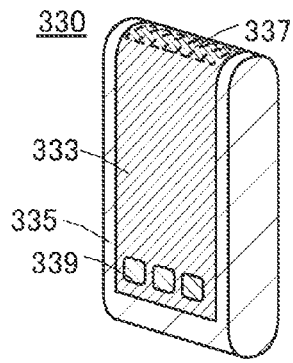
Figure 19G:
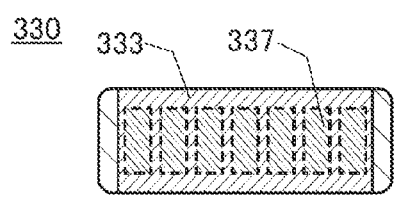
Figure 19H:
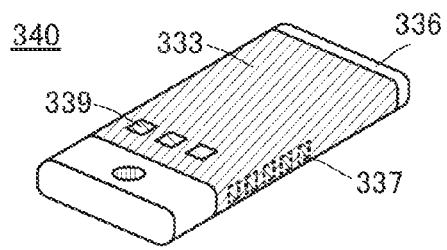

FIG. 19F is a perspective view illustrating the external shape of a portable information appliance 330. FIG. 19G is a top view of the portable information appliance 330. FIG. 19H is a perspective view illustrating the external shape of a portable information appliance 340.

The portable information appliances 330 and 340 function as one or more of a telephone set, an electronic notebook, and an information browsing system, for example. Specifically, each of the portable information appliances 330 and 340 can be used as a smartphone.

The portable information appliances 330 and 340 can display letters and image data on their plurality of surfaces. For example, three operation buttons 339 can be displayed on one surface (FIGS. 19F and 19H). Moreover, information 337 indicated by dashed rectangles can be displayed on another surface (FIGS. 19G and 19H). Examples of the information 337 include notification of a social networking service (SNS) message, display indicating reception of an email or an incoming call, the title or sender of an email or the like, the date, the time, remaining battery, and the reception strength of an antenna. Alternatively, the operation button 339, an icon, or the like may be displayed in place of the information 337. Although FIGS. 19F and 19G show the example in which the information 337 is displayed at the top, one embodiment of the present invention is not limited to this example. For instance, the information 337 may be displayed on the side as in the portable information appliance 340 in FIG. 19H.

For example, a user can see the display (here, the information 337) with the portable information appliance 330 put in a breast pocket.

Specifically, a caller's phone number, name, or the like of an incoming call is displayed at a position that can be observed from above the portable information appliance 330. Thus, the user can see the display without taking out the portable information appliance 330 from the pocket and decide whether to answer the phone.

The light-emitting device or the input/output device of one embodiment of the present invention can be used for a display portion 333 included in a housing 335 of the portable information appliance 330 and a housing 336 of the portable information appliance 340. According to one embodiment of the present invention, a highly reliable portable information appliance having a curved display portion can be provided with a high yield.

Figure 19I:
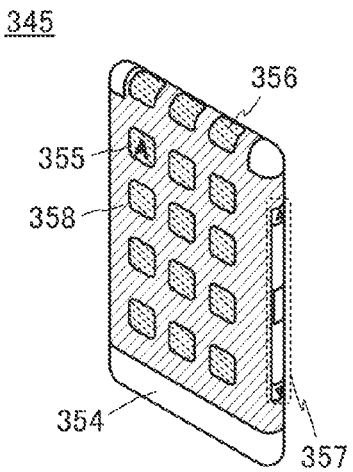

As in a portable information appliance 345 illustrated in FIG. 19I, information may be displayed on at least three surfaces. Here, as an example, information 355, information 356, and information 357 are displayed on different surfaces.

The light-emitting device or the input/output device of one embodiment of the present invention can be used for a display portion 358 included in a housing 354 of the portable information appliance 345. According to one embodiment of the present invention, a highly reliable portable information appliance having a curved display portion can be provided with a high yield.

This embodiment can be combined with any other embodiment as appropriate.

This application is based on Japanese Patent Application serial no. 2014-095140 filed with Japan Patent Office on May 2, 2014, the entire contents of which are hereby incorporated by reference.

What is claimed is:

1. A light-emitting device comprising:
a first substrate;
a light-emitting element over the first substrate;
a first conductive layer over the light-emitting element;
a first insulating layer over the first conductive layer;
a second conductive layer over the first insulating layer; and
a second substrate over the second conductive layer, wherein the light-emitting element comprises a first electrode over the first substrate, a light-emitting layer over the first electrode, and a second electrode over the light-emitting layer, wherein the second electrode, the first conductive layer, and the second conductive layer are electrically connected to each other, wherein the first insulating layer comprises an opening, wherein the first conductive layer and the second conductive layer are directly connected to each other in the opening, and wherein the first conductive layer and the second electrode are configured to transmit light emitted from the light-emitting element.

2. The light-emitting device according to claim 1, wherein a resistance of the second conductive layer is lower than a resistance of the second electrode.

3. The light-emitting device according to claim 1, wherein the first conductive layer comprises a metal oxide layer, and
wherein the second conductive layer comprises a metal layer.

4. The light-emitting device according to claim 1, further comprising a bonding layer between the light-emitting element and the first conductive layer.

5. The light-emitting device according to claim 1, wherein the first substrate and the second substrate are flexible.

6. The light-emitting device according to claim 1, further comprising a first transistor between the first substrate and the light-emitting element,
wherein the first transistor is electrically connected to the light-emitting element.

7. The light-emitting device according to claim 1, further comprising a coloring layer between the first insulating layer and the first conductive layer,
wherein the coloring layer overlaps with the light-emitting element.

8. The light-emitting device according to claim 1, further comprising a first light-blocking layer between the first insulating layer and the first conductive layer,
wherein the first light-blocking layer overlaps with the second conductive layer.

9. The light-emitting device according to claim 1, further comprising a second light-blocking layer between the second substrate and the first conductive layer,
wherein the second light-blocking layer overlaps with the second conductive layer.

10. The light-emitting device according to claim 1, further comprising a second insulating layer,
wherein an end portion of the first electrode is covered by the second insulating layer, and
wherein the first conductive layer is in contact with the second electrode in a region overlapping with the first insulating layer.

11. An input/output device comprising:
the light-emitting device according to claim 1; and
a sensor portion comprising a capacitor,
wherein the light-emitting device and the sensor portion overlap with each other.

12. An input/output device comprising:
a first substrate;
a first transistor over the first substrate;
a light-emitting element over the first transistor;
a first conductive layer over the light-emitting element;
a first insulating layer over the first conductive layer;
a second conductive layer over the first insulating layer;
a second substrate over the second conductive layer; and
a second transistor and a capacitor between the first conductive layer and the second substrate, wherein the first transistor and the light-emitting element are electrically connected to each other, wherein the second transistor and the capacitor are electrically connected to each other, wherein the first conductive layer overlaps with the light-emitting element, wherein the first conductive layer is configured to transmit light emitted from the light-emitting element, wherein the first insulating layer comprises an opening, wherein the first conductive layer and the second conductive layer are directly connected to each other in the opening, wherein the second conductive layer is formed on a same plane as a gate electrode or source and drain electrodes of the second transistor, and wherein the second conductive layer comprises a same material as a material of the gate electrode or the source and drain electrodes of the second transistor.

13. The input/output device according to claim 12, further comprising a bonding layer between the light-emitting element and the first conductive layer.

14. The input/output device according to claim 12,
wherein the light-emitting element comprises a first electrode over the first substrate, a light-emitting layer over the first electrode, and a second electrode over the light-emitting layer, and
wherein the second electrode is electrically connected to the first conductive layer.

15. The input/output device according to claim 12,
wherein the light-emitting element is configured to emit light toward the second substrate.

16. The input/output device according to claim 12,
wherein the first conductive layer comprises a metal oxide layer, and
wherein the second conductive layer comprises a metal layer.

17. The input/output device according to claim 12,
wherein the first conductive layer is configured to be supplied with a predetermined potential.

18. The input/output device according to claim 12, wherein the first substrate and the second substrate are flexible.

19. The input/output device according to claim 12, further comprising a coloring layer between the first insulating layer and the first conductive layer,
wherein the coloring layer overlaps with the light-emitting element.

20. The input/output device according to claim 12, further comprising a first light-blocking layer between the first insulating layer and the first conductive layer,
wherein the first light-blocking layer overlaps with the second conductive layer.

21. The input/output device according to claim 12, further comprising a second light-blocking layer between the second substrate and the first conductive layer,
wherein the second light-blocking layer overlaps with the second conductive layer.

* * * * *